(12) United States Patent
Lau et al.

(10) Patent No.: US 10,707,190 B2
(45) Date of Patent: Jul. 7, 2020

(54) LED BACKPLANE HAVING PLANAR BONDING SURFACES AND METHOD OF MAKING THEREOF

(71) Applicant: GLO AB, Lund (SE)

(72) Inventors: Tsun Lau, Sunnyvale, CA (US); Fariba Danesh, Pleasanton, CA (US); Timothy Gallagher, Los Altos Hills, CA (US); Anusha Pokhriyal, Sunnyvale, CA (US)

(73) Assignee: GLO AB, Lund (SE)

( * ) Notice: Subject to any disclaimer, the term of this patent is extended or adjusted under 35 U.S.C. 154(b) by 184 days.

(21) Appl. No.: 15/949,514

(22) Filed: Apr. 10, 2018

(65) Prior Publication Data

US 2019/0312015 A1 Oct. 10, 2019

(51) Int. Cl.
*H01L 25/075* (2006.01)
*H01L 33/62* (2010.01)
(Continued)

(52) U.S. Cl.
CPC .......... *H01L 25/0753* (2013.01); *H01L 24/83* (2013.01); *H01L 33/0079* (2013.01);
(Continued)

(58) Field of Classification Search
CPC .................................................. H01L 25/073
See application file for complete search history.

(56) References Cited

U.S. PATENT DOCUMENTS 8,241,932 B1 * 8/2012 Yu .................... H01L 25/0753
257/E21.122
9,941,262 B2 4/2018 Thompson
(Continued)

FOREIGN PATENT DOCUMENTS

KR 10-2011-0079903 A 7/2011
WO WO2016022824 A1 2/2016
(Continued)

OTHER PUBLICATIONS

International Search Report and Written Opinion of the International Searching Authority for International Application No. PCT/US2019/025622, dated Jul. 18, 2019, 9 pages.
(Continued)

*Primary Examiner* — Mounir S Amer
(74) *Attorney, Agent, or Firm* — The Marbury Law Group, PLLC

(57) ABSTRACT

A backplane can have a non-planar top surface. Insulating material portions including planar top surface regions located within a same horizontal plane are formed over the backplane. A two-dimensional array of metal plate clusters is formed over the insulating material portions. Each of the metal plate clusters includes a plurality of metal plates. Each metal plate includes a horizontal metal plate portion overlying a planar top surface region and a connection metal portion connected to a respective metal interconnect structure in the backplane. A two-dimensional array of light emitting device clusters is bonded to the backplane through respective bonding structures. Each light emitting device cluster includes a plurality of light emitting devices overlying a respective metal plate cluster.

10 Claims, 27 Drawing Sheets

(51) Int. Cl.
*H01L 33/00* (2010.01)
*H01L 23/00* (2006.01)
*H01L 33/06* (2010.01)
*H01L 33/32* (2010.01)

(52) U.S. Cl.
CPC .......... *H01L 33/62* (2013.01); *H01L 33/0025* (2013.01); *H01L 33/06* (2013.01); *H01L 33/32* (2013.01); *H01L 2224/8321* (2013.01); *H01L 2224/83193* (2013.01); *H01L 2224/83224* (2013.01); *H01L 2224/83815* (2013.01); *H01L 2933/0066* (2013.01)

(56) References Cited

U.S. PATENT DOCUMENTS

| | | | |
|---|---|---|---|
| 10,304,810 B2* | 5/2019 | Gardner | ................ H01L 27/156 |
| 2002/0171089 A1 | 11/2002 | Okuyama et al. | |
| 2011/0049707 A1* | 3/2011 | Seto | ........................ H01L 24/11 |
| | | | 257/737 |
| 2015/0097201 A1 | 4/2015 | Imai | |
| 2015/0340346 A1 | 11/2015 | Chu et al. | |
| 2016/0035924 A1 | 2/2016 | Oraw et al. | |
| 2016/0093665 A1 | 3/2016 | Schubert et al. | |
| 2017/0162552 A1 | 6/2017 | Thompson | |
| 2017/0288102 A1* | 10/2017 | Farrens | ................ H01L 27/156 |
| 2017/0365755 A1 | 12/2017 | Chu | |
| 2017/0373046 A1 | 12/2017 | Gardner et al. | |
| 2018/0097033 A1 | 4/2018 | Ahmed et al. | |
| 2019/0296193 A1* | 9/2019 | Vampola | ................ H01L 33/46 |

FOREIGN PATENT DOCUMENTS

| | | |
|---|---|---|
| WO | WO2016100657 A2 | 6/2016 |
| WO | WO2016100662 A1 | 6/2016 |
| WO | WO2017099905 A1 | 6/2017 |
| WO | WO2017175051 A1 | 10/2017 |

OTHER PUBLICATIONS

Invitation to Pay Additional Fees from the International Searching Authority for PCT/IB2017/000334, dated Jun. 19, 2017, 16 pages.
International Search Report and Written Opinion of the International Searching Authority for International Patent Application No. PCT/IB2017/000334, dated Aug. 9, 2017, 20 pages.
Jansen, M. et al., "Led Backlight Unit With Separately and Independently Dimmable Zones for a Liquid Crystal Display," U.S. Appl. No. 15/429,338, filed Feb. 10, 2017, 74 pages.
Pokhriyal, A. et al., "Method of Selectively Transferring LED Die to a Backplane Using Height Controlled Bonding Structures," U.S. Appl. No. 15/432,216, filed Feb. 14, 2017, 66 pages.
Gardner, N. et al., "Method of Making a Light Emitting Diode Array on a Backplane," U.S. Appl. No. 15/533,866, filed Jun. 7, 2017.
Danesh, F. et al., "Selective Die Repair on a Light Emitting Device Assembly," U.S. Appl. No. 15/597,654, filed May 17, 2017.

* cited by examiner

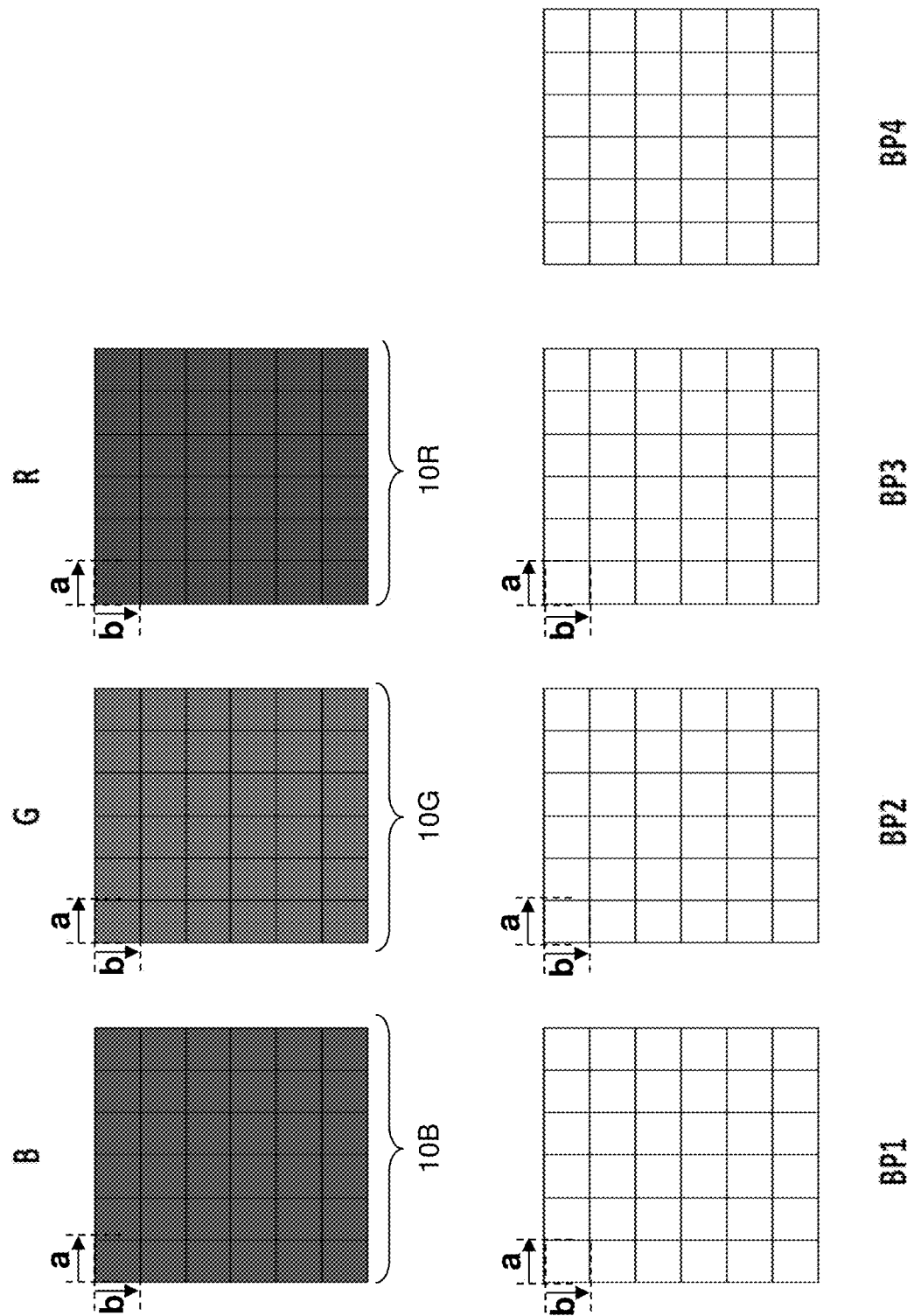

LED BACKPLANE HAVING PLANAR BONDING SURFACES AND METHOD OF MAKING THEREOF

FIELD

The embodiments of the invention are directed generally to a method of manufacturing semiconductor light emitting devices, and specifically to methods for manufacturing a light emitting device including a backplane and light emitting device bonded thereto employing planar bonding surfaces.

BACKGROUND

Light emitting devices such as light emitting devices are used in electronic displays, such as liquid crystal displays in laptops or LED televisions. Light emitting devices include light emitting diodes (LEDs) and various other types of electronic devices configured to emit light.

SUMMARY

According to an aspect of the present disclosure, a light emitting device assembly is provided, which comprises: a backplane comprising a substrate containing metal interconnect structures; insulating material portions having a lower elastic modulus than the substrate located over the backplane, wherein the insulating material portions contain a respective planar top surface region such that the planar top surface regions of the insulating material portions are located within a same horizontal plane; a two-dimensional array of metal plate clusters, wherein each of the metal plate clusters comprises a plurality of metal plates, each metal plate including a horizontal metal plate portion overlying a planar top surface region of a respective insulating material portion and a connection metal portion extending between the horizontal metal plate portion and a respective one of the metal interconnect structures; and a two-dimensional array of light emitting device clusters bonded to the backplane through respective bonding structures, wherein each light emitting device cluster comprises a plurality of light emitting devices overlying a respective metal plate cluster.

According to another aspect of the present disclosure, a method of forming a light emitting device assembly is provided, which comprises: providing a backplane comprising a substrate containing metal interconnect structures; forming insulating material portions including a respective planar top surface region over the backplane, wherein the planar top surface regions of the insulating material portions are within a same horizontal plane; forming a two-dimensional array of metal plate clusters over the insulating material portions, wherein each of the metal plate clusters comprises a plurality of metal plates, each metal plate including a horizontal metal plate portion overlying a planar top surface region of a respective insulating material portion and a connection metal portion extending between the horizontal metal plate portion and a respective one of the metal interconnect structures; and bonding a two-dimensional array of light emitting device clusters to the backplane through respective bonding structures, wherein each light emitting device cluster comprises a plurality of light emitting devices overlying a respective metal plate cluster.

BRIEF DESCRIPTION OF THE DRAWINGS

FIGS. 2A-2E are a schematic sequence for transfer of light emitting devices according to the exemplary transfer pattern illustrated in FIG. 1.

DETAILED DESCRIPTION

Figure 1:
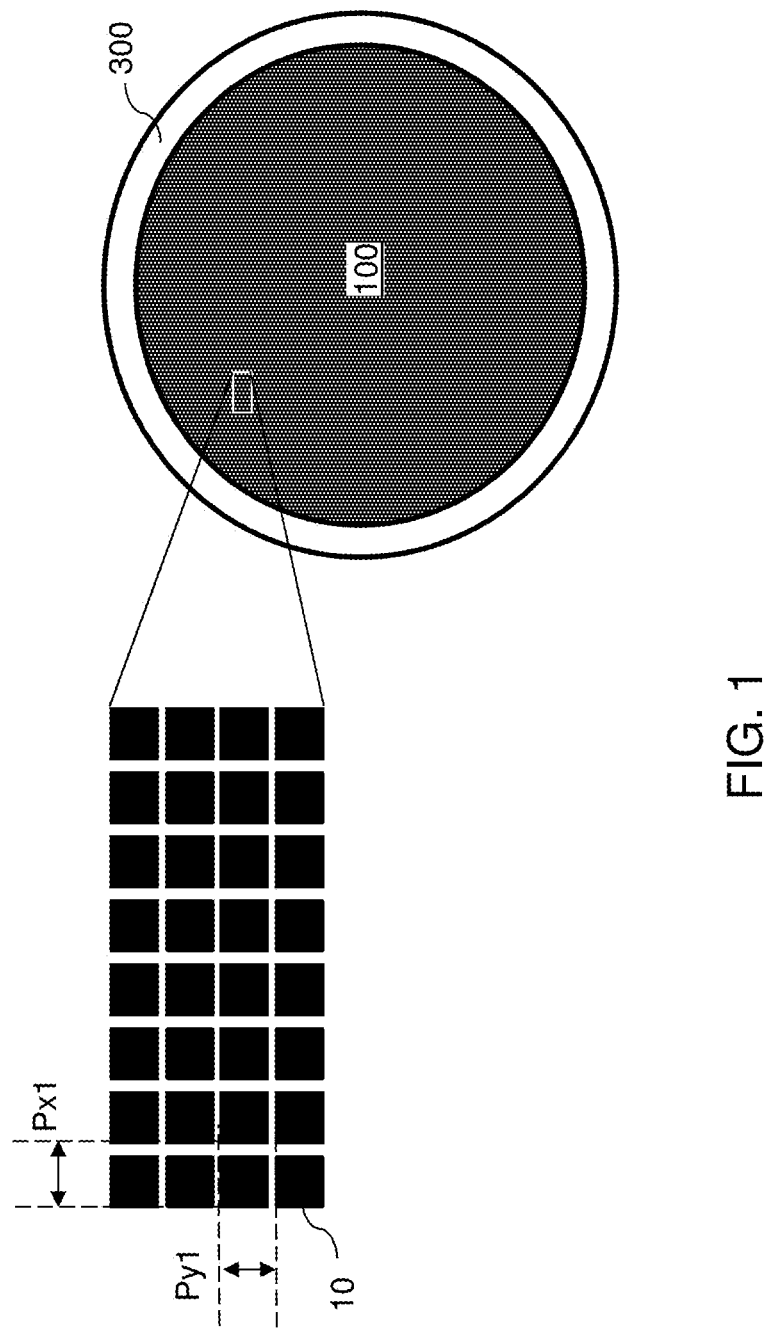
FIG. 1 schematically illustrates a substrate including dies of light emitting devices according to an embodiment of the present disclosure.

As stated above, the present disclosure is directed to methods for manufacturing a light emitting device including a backplane and light emitting device bonded thereto employing coplanar bonding surfaces, and light emitting devices formed by the same, the various aspects of which are described below. Throughout the drawings, like elements are described by the same reference numeral. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure.

As used herein, a "light emitting device" refers to any device that is configured to emit light and includes, but is not limited to, a light emitting device (LED), a laser, such as a vertical-cavity surface-emitting laser (VCSEL), and any other electronic device that is configured to emit light upon application of a suitable electrical bias. A light emitting device may be a vertical structure (e.g., a vertical LED) in which the p-side and n-side contacts are located on opposite sides of the structure or a lateral structure in which the p-side and n-side contacts are located on the same side of the structure. As used herein, a "light emitting device assembly" refers to an assembly in which at least one light emitting device is structurally fixed with respect to a carrier structure, which can include, for example, a substrate, a matrix, or any other structure configured to provide stable mechanical support to the at least one light emitting device.

In the present disclosure, a method is provided for transferring an array of devices (such as an array of light emitting devices or an array of sensor devices) from a growth substrate to a target substrate. The target substrate can be any substrate on which formation of multiple types of devices in any configuration is desired. In an illustrative example, the target substrate can be a backplane substrate such as an active or passive matrix backplane substrate for driving light emitting devices. As used herein, a "backplane" or a "backplane substrate" refers to any substrate configured to affix multiple devices thereupon. In one embodiment, the center-to-center spacing of neighboring light emitting devices on the backplane substrate can be is an integer multiple of the center-to-center spacing of neighboring light emitting devices on the growth substrate. The light emitting devices may include a plurality of light emitting devices, such as a group of two light emitting devices, one configured to emit blue light and one configured to emit green light. The light emitting devices may include a group of three light emitting devices, one configured to emit blue light, one configured to emit green light, and one configured to emit red light. As used herein, "neighboring light emitting devices" refer to a plurality of two or more light emitting devices located in closer proximity than at least another light emitting device. The method of the present disclosure can provide selective transfer of a subset of light emitting devices from a light emitting device array on a growth substrate to the backplane substrate.

Devices of a same type can be fabricated on respective initial growth substrates. As used herein, an "initial growth substrate" refers to a substrate that is processed to form devices thereupon or therein. The devices can include light emitting devices and/or sensor devices (e.g., photodetectors) and/or any other electronic devices. The light emitting devices can be any type of light emitting devices, i.e., vertical light emitting diodes, lateral light emitting diodes, or any combination thereof. Devices of the same type can be formed on each initial growth substrate, the types being different from one initial growth substrate to another. The devices can be formed as an array on the respective initial growth substrates.

Utilization of a high percentage of light emitting devices as manufactured on an initial growth substrate for incorporation into backplanes is an essential component of economically manufacturing a direct view light emitting device assembly. Generally, a light emitting device assembly provides a rectangular viewing area, while initial growth substrates typically have circular device areas. After transfer of light emitting devices from a rectangular region of an initial growth substrate to a backplane, a circular substrate can have unutilized region from which devices are not transferred. Methods of the present disclosure provide methods for utilizing the complement of a rectangular center area of an initial growth substrate, or in case devices are transferred to a transfer substrate, for utilizing the complement of a rectangular center area of a transfer substrate.

The methods of the present disclosure employ one of more of the following methods. In some embodiments, dies (i.e., instances of a light emitting device) can be transferred to a temporary support system and placed on a backplane one by one. In some embodiments, defect maps can be supplied to a temporary repair template substrate, and can be attached to a backplane in parallel. In some embodiment, local area replacement or patterned pixel transfer can be employed.

Referring to FIG. 1, a substrate including dies of light emitting devices 10 is illustrated. The substrate may include an edge exclusion region 300 at a periphery, in which devices are not formed. The substrate can include light emitting devices of a same type (which is herein referred to as first type) arranged in a first array configuration. The light emitting devices of the first type are multiple instances of the same device, which may be, for example, light emitting devices that emit light at a same peak wavelength. For example, the light emitting devices of the first type may be red light emitting devices, green light emitting devices, or blue light emitting devices.

The first array configuration has a primary-direction pitch Px1 along a respective primary direction (i.e., the primary direction of the first array configuration) and has a secondary-direction pitch Py1 along a respective secondary direction (i.e., the secondary direction of the first array configuration). As used herein, a primary direction and a second direction of an array configuration refer to two directions along which a unit cell of the array configuration is repeated. In a rectangular array configuration, the primary direction and the second direction may be perpendicular to each other, and are referred to as an x-direction and a y-direction.

The light emitting devices 10 on the substrate can be transferred to multiple backplanes having bonding sites in the second array configuration. A predetermined transfer pattern and a predetermined transfer sequence can be employed for transfer of the light emitting devices 10. Light emitting devices of different types provided from additional substrates can be employed in conjunction with the light emitting devices 10 from the substrate to provide a functional direct view light emitting device assembly.

Referring to FIGS. 2A-2E, an exemplary transfer pattern and an exemplary transfer sequence are illustrated for transferring three different types of devices (10B, 10G, 10R) (e.g., blue, green and red emitting LEDs, respectively) to four backplanes (BP1, BP2, BP3, BP4). The three different types of devices (10B, 10G, 10R) can be provided on three source substrates (B, G, R), which can comprise three transfer substrates, or three growth substrates, or combinations thereof. The first light emitting devices 10B can be provided on the first source substrate B, the second light emitting devices 10G can be provided on the second source substrate G, and the third light emitting devices 10R can be provided on the third source substrate R.

Figure 2B:
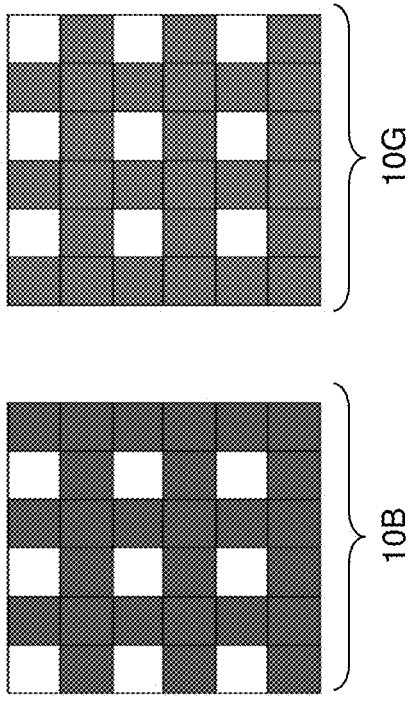
Figure 2B:
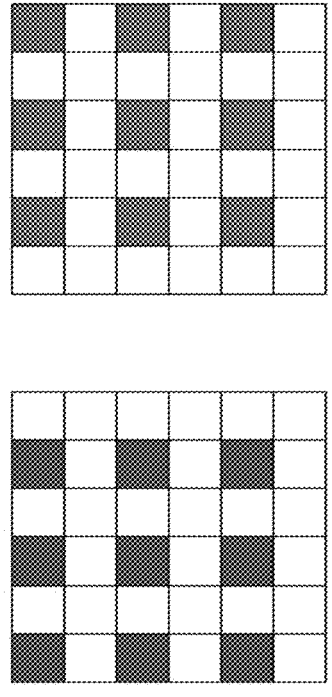
Figure 2B:
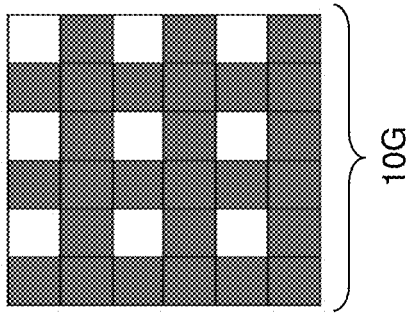
Figure 2B:
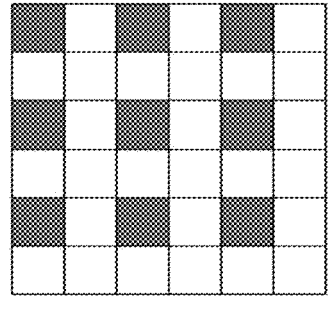
Figure 2B:
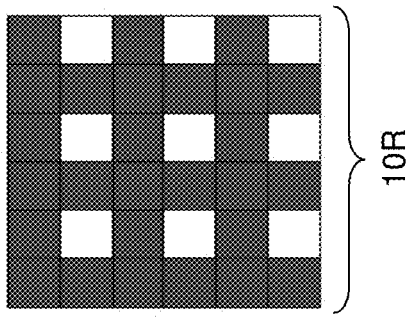
Figure 2B:
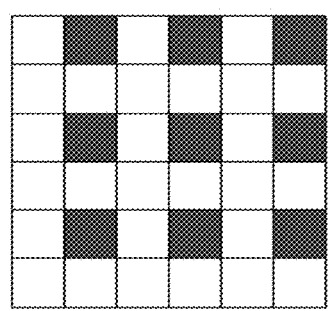
Figure 2B:
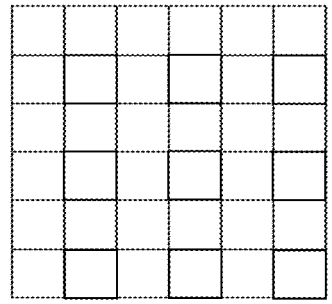
Figure 2C:
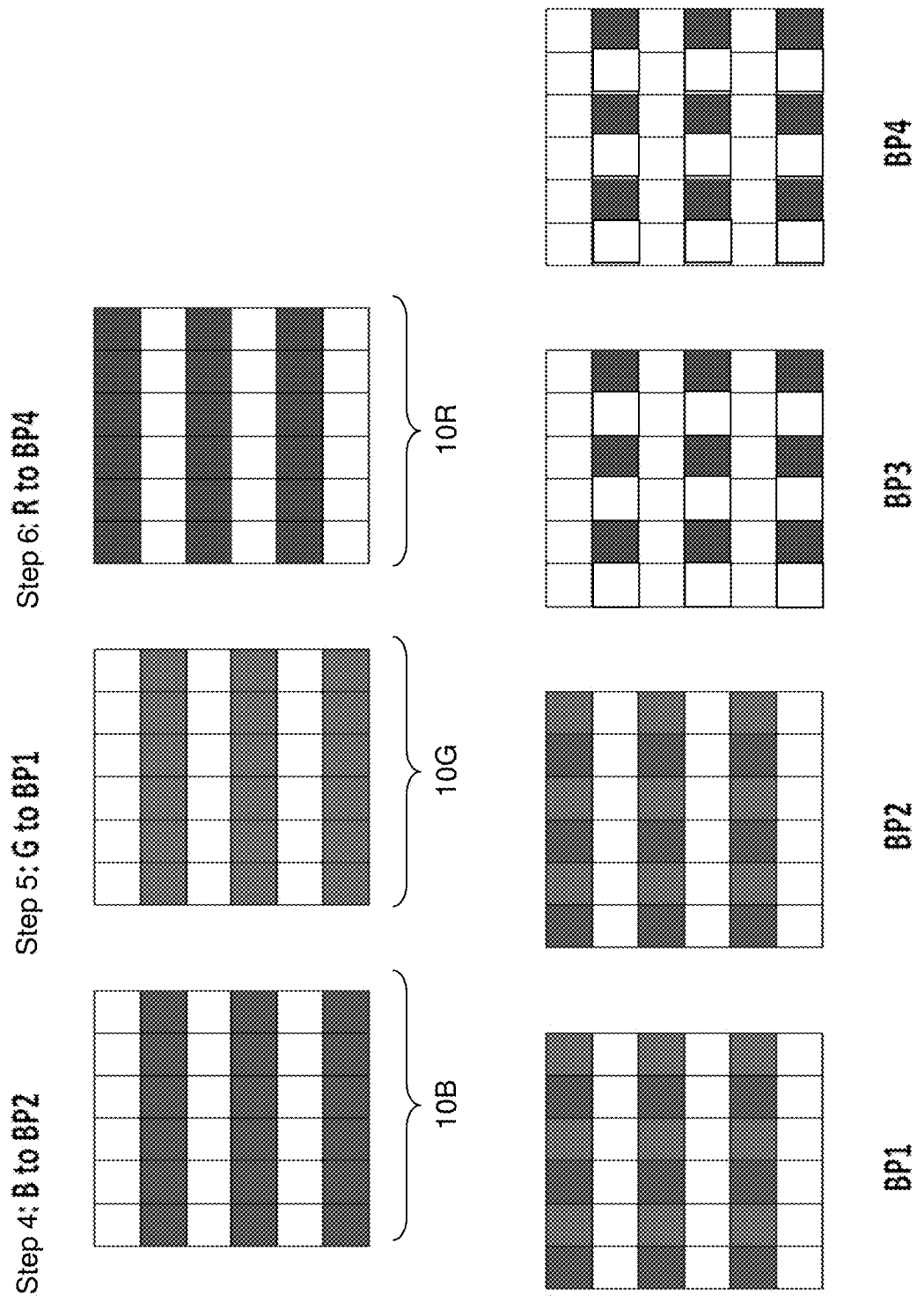
Figure 2D:
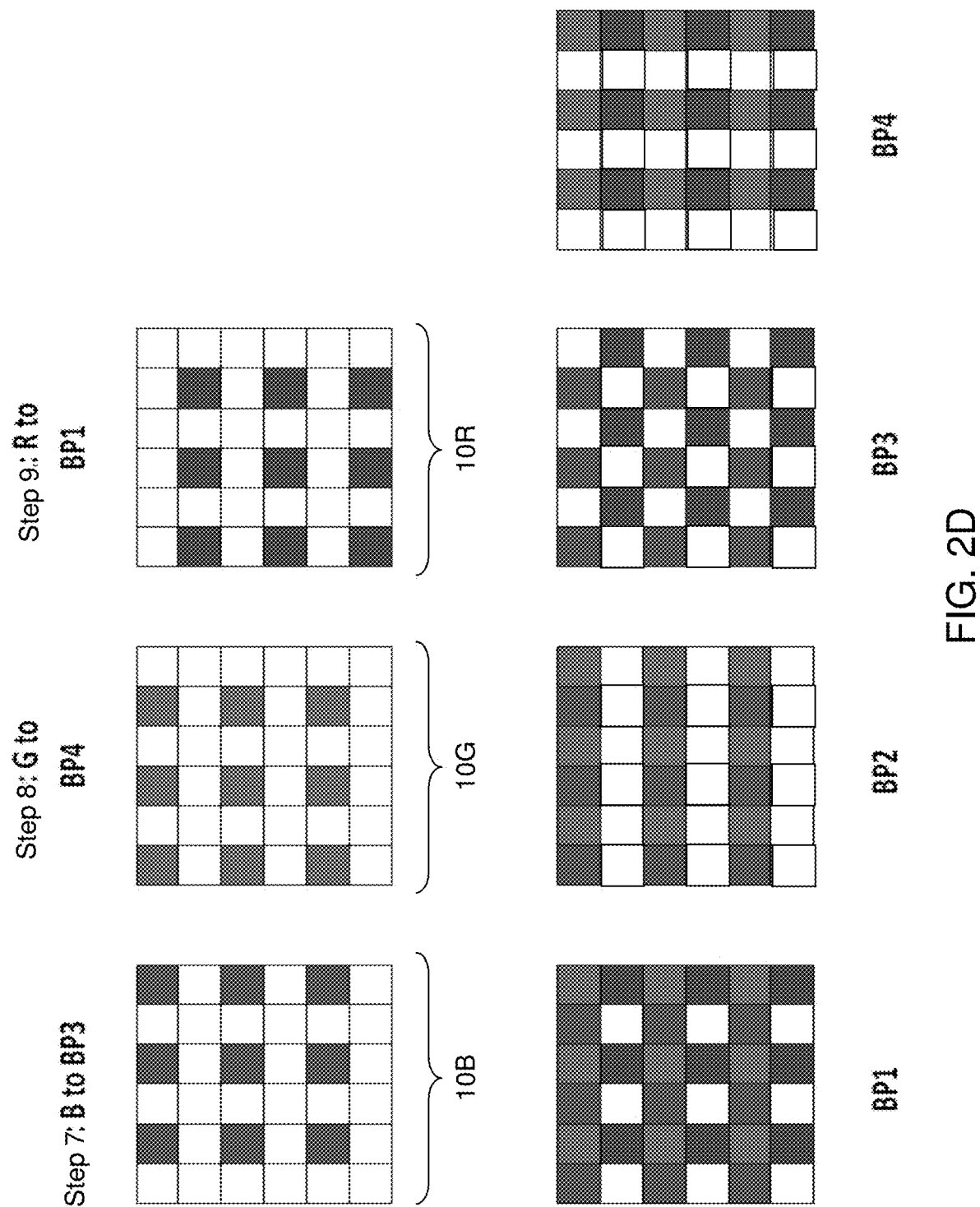
Figure 2E:
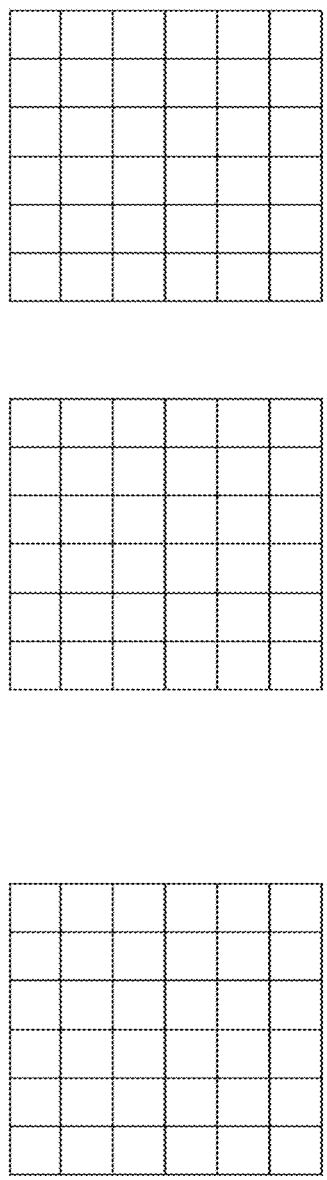
Figure 2E:
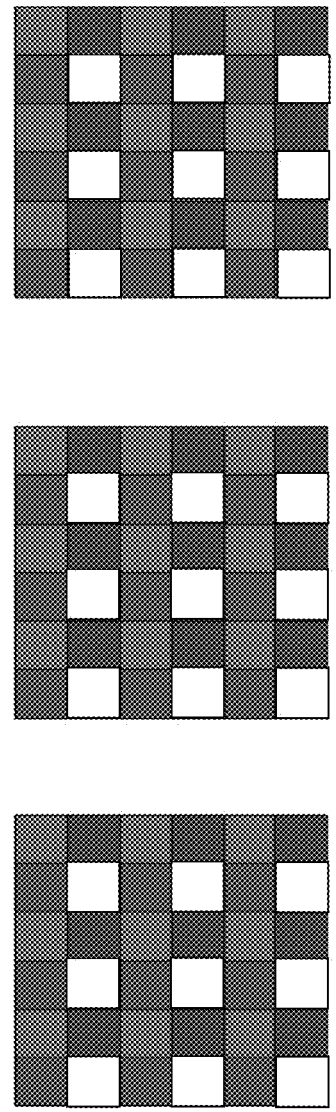
Figure 2E:
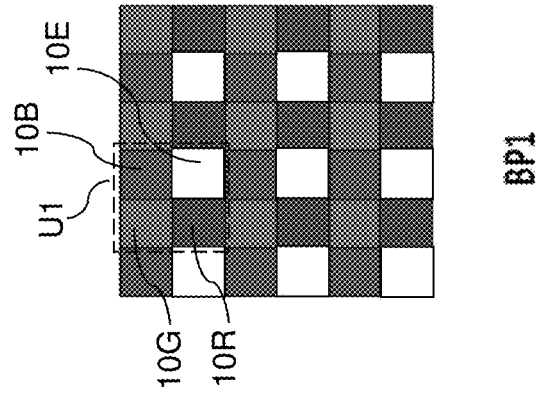

Changes in the presence or absence of the various devices (10B, 10G, 10R) on the source substrates (B, G, R) and the backplanes (BP1, BP2, BP3, BP4) at each step of the transfer sequence are illustrated in FIGS. 2A-2E. FIG. 2A corresponds to a configuration prior to any transfer of the devices (10B, 10G, 10R), FIG. 2B corresponds to the configuration after performing transfer steps 1-3, FIG. 2C corresponds to the configuration after performing steps 4-6, FIG. 2D corresponds to the configuration after performing steps 7-9, and FIG. 2E corresponds to the configuration after performing steps 10-12. It should be noted that steps 1-3 as illustrated in FIG. 2B may be shuffled in any order because steps 1-3 are independent of one another, steps 4-6 as illustrated in FIG. 2C may be shuffled in any order because steps 4-6 are independent of one another, steps 7-9 as illustrated in FIG. 2D may be shuffled in any order because steps 7-9 are independent of one another, and steps 10-12 as illustrated in FIG. 2E may be shuffled in any order because steps 10-12 are independent of one another.

While the exemplary transfer pattern and the exemplary transfer sequence is illustrated for cases in which four source substrates (B, G, R) and four backplanes (BP1, BP2, BP3, BP4) are employed, the method of the present disclosure can be applied to any case in which m transfer assemblies and n backplanes are employed, in which m is an integer greater than 1, n is an integer greater than 1, and n is not less than m. The n backplanes bond with devices from the m transfer assemblies to form n integrated light emitting device assemblies. In one embodiment, n can be the same as, or greater than, m.

A plurality of transfer assemblies, e.g., m transfer assemblies, is provided. Each of the m transfer assemblies comprises a respective source substrate (B, G, R) and respective devices (10B, 10G, 10R) within a two-dimensional array having a same two-dimensional periodicity. As used herein, a same two-dimensional periodicity for multiple structures refers to a configuration in which each of the multiple structures has a respective unit structure and instances of the respective unit structure are repeated along two independent directions of periodicity (e.g., a first periodicity direction and a second periodicity direction), and the unit structures are repeated along the respective first periodicity direction with a same first pitch and are repeated along the respective second periodicity direction with a same second pitch for all of the multiple structures, and the angle between the first periodicity direction and the second periodicity direction is the same for all of the multiple structures. Each of the n backplanes has a periodic repetition of respective unit conductive bonding structures pattern configured to mount m types of devices.

Each of the m types of devices can be one of the devices within a respective transfer assembly among the m transfer assemblies. The pitches of each unit conductive bonding structures pattern along two independent directions within each of the n backplanes can be multiples of a respective pitch of the two-dimensional periodicity of the devices within each of the m transfer assemblies. In an illustrative example, each of the devices (10B, 10G, 10R) can be periodic within a respective transfer assembly with the first periodicity of a along a first direction, and with the second periodicity of b along a second direction (which may be perpendicular to the first direction). The unit conductive bond pad pattern within each of the backplanes can have the first periodicity of 2a (which is an integer multiple of a) along a first direction, and with the second periodicity of 2b (which is an integer multiple of b) along a second direction (which may be perpendicular to the first direction).

Subsets of devices (10B, 10G, 10R) from each of the m transfer assemblies can be sequentially transferred to a respective backplane (BP1, BP2, BP3, BP4) among the n backplanes by disposing each respective transfer assembly over the respective backplane (BP1, BP2, BP3, BP4) at locations that preclude collision of existing devices on the respective transfer assembly with any devices (10B, 10G, 10R), if any, that are previously bonded to the respective backplane (BP1, BP2, BP3, BP4).

In one embodiment, a unit cell U1 of the second array configuration of the light emitting device assembly can be defined by a rectangle having a first pair of sides having a first length of the second primary-direction pitch Px2 along a respective primary direction and having a second pair of sides having a second length of the second secondary-direction pitch Py2 along a respective secondary direction. In one embodiment, the unit cell U1 can include a first-type light emitting device 10R (which may be a red light emitting device), a second-type light emitting device 10G (which may be a green light emitting device), a third-type light emitting device 10B (which may be a blue light emitting device), and a respective empty site 10E configured to accommodate a respective repair light emitting device.

If each of the first, second, and third-type light emitting devices (10R, 10G, 10B) of a pixel is functional, such a pixel is a functional pixel, and attachment of any repair light emitting device to the pixel is not necessary. If any of the first, second, and third-type light emitting devices (10R, 10G, 10B) of a pixel is defective, i.e., non-functional, such a pixel is a defective, i.e., non-functional, pixel, and attachment of a repair light emitting device to the pixel is not necessary. In this case, the empty site 10E of such a defective pixel is employed to attach a repair light emitting device. Each employ site 10E of the defective pixels is a repair site to which a repair light emitting device needs to be attached.

In general, the light emitting device assembly includes a backplane and instances of light emitting devices of the first type at bonding sites in the second array configuration. Repair sites can be identified for any given light emitting device assembly, which may be formed employing the light emitting devices from the substrate including the base pitch region 100, and/or employing light emitting devices from additional substrates. In one embodiment, a first set of repair sites can be defined based on the functionality of one type of light emitting devices, e.g., light emitting devices of the first type. Each of the first set of repair sites can be an empty site 10E configured to accommodate a respective repair light emitting device. Each of the first set of repair sites can be located within a pixel including a defective instance of the light emitting device of the first type.

Figure 3A:
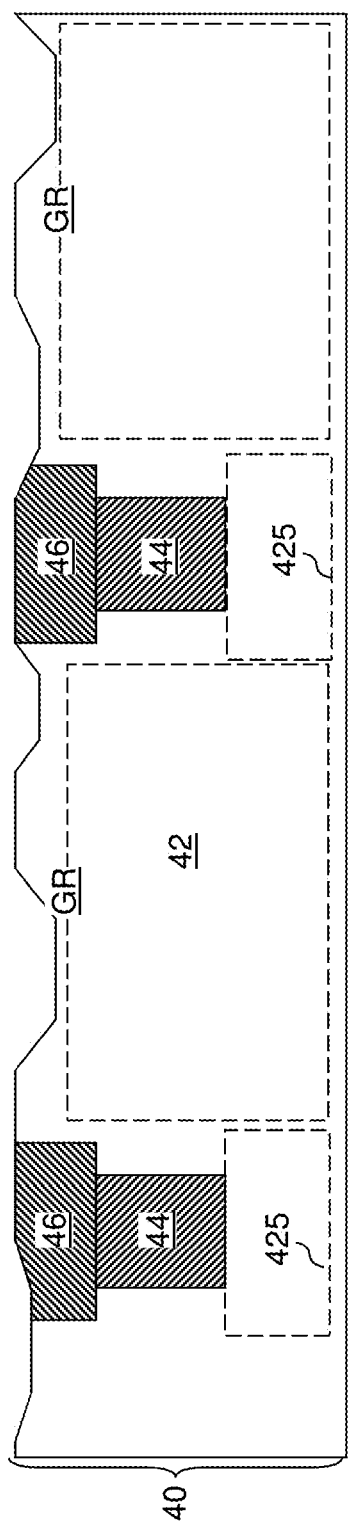
FIG. 3A is a vertical cross-sectional view of an exemplary structure for formation of a light emitting device that includes a backplane according to an embodiment of the present disclosure.
Figure 3B:
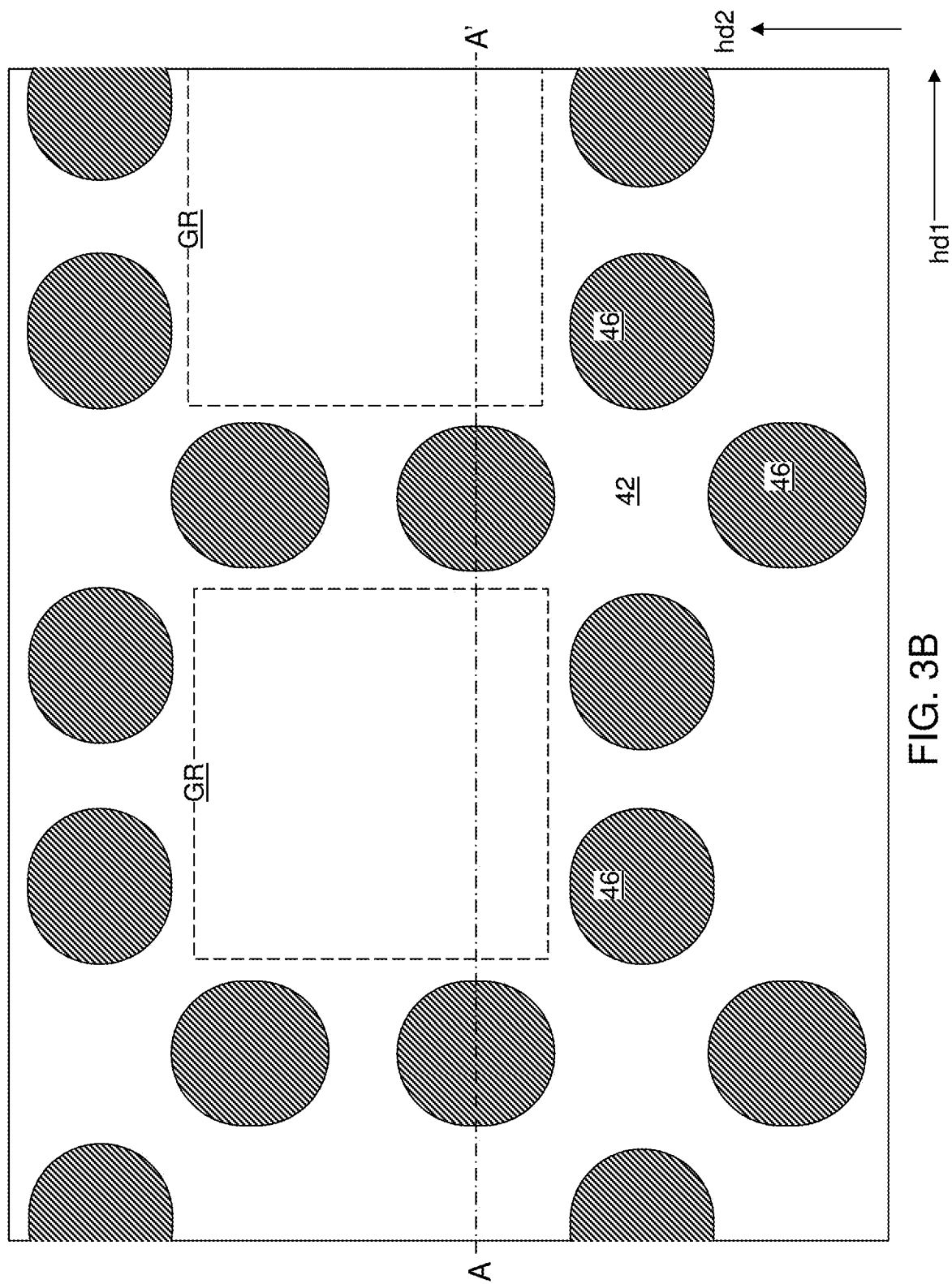
FIG. 3B is a top-down view of the exemplary structure of FIG. 3A.

Referring to FIGS. 3A and 3B, a backplane 40 is provided, which can be employed as any of the four backplanes (BP1, BP2, BP3, BP4) described above. The backplane 40 includes the substrate 42 containing metal interconnect structures (46, 44, 425) located on the substrate 42 and/or embedded within the substrate 42. The substrate 42 can be optically transparent or optically opaque. As used herein, an "optically transparent" element or a "transparent" element refers to an element that transmits at least 50% of light over more than 90% of the visible spectrum range, i.e., the wavelength range from 400 nm to 800 nm. If the substrate 42 is optically transparent then it may transmit more than 50% of light at the wavelength of an optional laser beam to be subsequently employed to induce reflow of solder materials in a bonding process, if a laser reflow process is used.

In one embodiment, the substrate 42 can include a first dielectric material having a first elastic modulus, i.e., a first Young's modulus. In one embodiment, the substrate 42 can include any dielectric material that can be employed to provide a printed circuit board (PCB) as known in the art. In one embodiment, the metal interconnect structures (46, 44, 425) can be laid out on and/or within the substrate 42 to provide gap regions GR in which the metal interconnect structures (46, 44, 425) are not present. In one embodiment, the gap regions GR can be arranged as a periodic two-dimensional array. The pitch of the gap regions GR along a first horizontal direction hd1 can be an integer M times the primary-direction pitch Px1 of the light emitting devices 10 described above, and the pitch of gap regions GR along a second horizontal direction hd2 can be an integer M times the secondary-direction pitch Py1 of the light emitting devices 10 described above.

The metal interconnect structures (46, 44, 425) are arranged to provide electrically conductive paths to the light emitting devices to be subsequently attached to the front side of the backplane 40. In an illustrative example, the metal interconnect structures (46, 44, 425) can include an array of conductive via structures 46 having physically exposed surfaces on the front side of the backplane 40. Further, the metal interconnect structures (46, 44, 425) can include metal lines 44 that extend horizontally to provide lateral electrical connection between a respective conductive via structures 46 and additional metal interconnect structures 425, which may include additional metal via structures, additional metal line structures, and/or conductive traces. In one embodiment, physically exposed components of the metal interconnect structures (46, 44, 425), such as the conductive via structures 46, can be arranged as a two-dimensional periodic array having the same two-dimensional periodicity as the two-dimensional array of gap regions GR.

The backplane 40 can have a non-planar top surface that can be caused by intentionally formed local dimples and/or protrusions and/or caused by unintentional distortion such as bowing, bending, and/or arching of the substrate 42. Such a non-planar top surface causes physically exposed surfaces of the conductive via structures 46 to be located at different levels and/or to have tilted top surfaces. Bonding light emitting devices on vertically offset surfaces and/or tilted physically exposed surfaces of the conductive via structures 46 can result in degradation of quality of bonding, and may induce electrical opens and/or other structural defects. According to an embodiment of the present disclosure, additional structures are formed over the backplane 40 prior to bonding the light emitting devices to provide horizontal bonding surfaces located within a same two-dimensional, substantially horizontal plane. As used herein, a "two-dimensional" plane refers to a Euclidean plane and excludes Riemannian (curved) planes.

Figure 4:
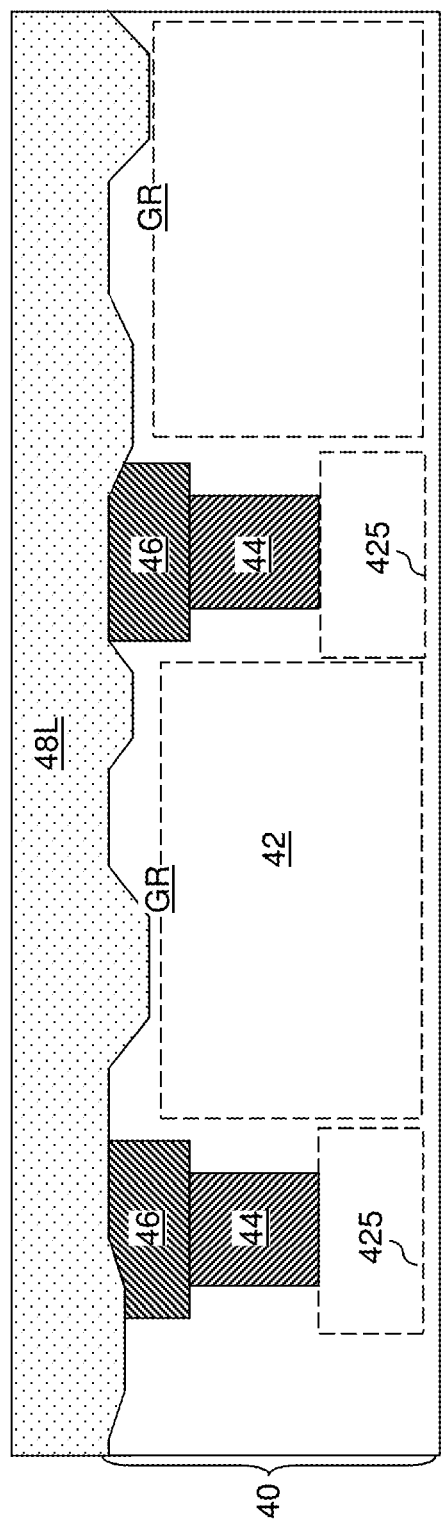
FIG. 4 is a vertical cross-sectional view of the exemplary structure after formation of a continuous insulating material layer over the backplane according to an embodiment of the present disclosure.

Referring to FIG. 4, a second dielectric material having a second elastic modulus is formed over the backplane 40 as a continuous insulating material layer 48L. The second dielectric material can be an optically transparent or opaque material, and can have an elastic modulus that is less than the first elastic modulus. For example, the second elastic modulus can be less than 80% of the first elastic modulus, and may be in a range from 1% to 60% of the first elastic modulus to provide an increased level of elasticity to bonding pads during a subsequent bonding process. For example, the second insulating material layer 48L can include, and/or can consist essentially of, an epoxy based polymer, such as SU-8 negative photoresist material, a silicone-based polymer material, a benzocyclobutene-based (BCB) polymer, or other organic polymer materials. In one embodiment, the second insulating material layer 48L can include a self-planarizing polymer material that can be applied and cured to provide a planar top surface that extends over the entirety of the non-planar top surface of the backplane 40. The thickness of the continuous insulating material layer 48L can be in a range from 200 nm to 20 microns, although lesser and greater thicknesses can also be employed.

Figure 5A:
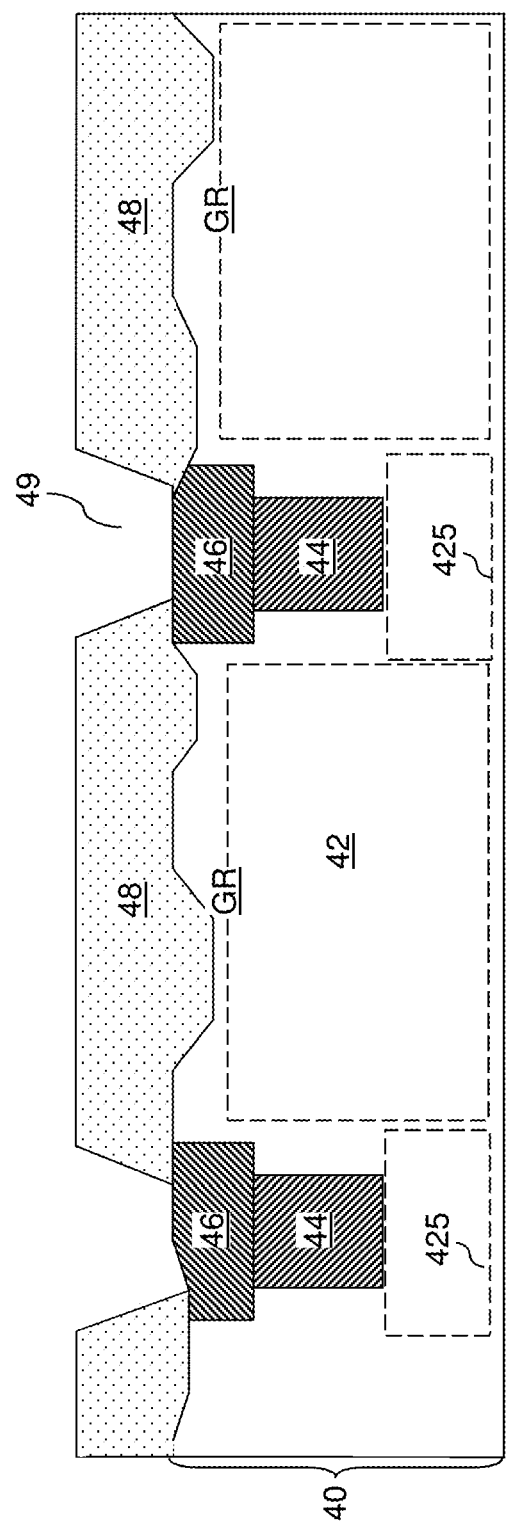
FIG. 5A is a vertical cross-sectional view of the exemplary structure after formation of insulating material portions by patterning the continuous insulating material layer according to first and second embodiments of the present disclosure.
Figure 5B:
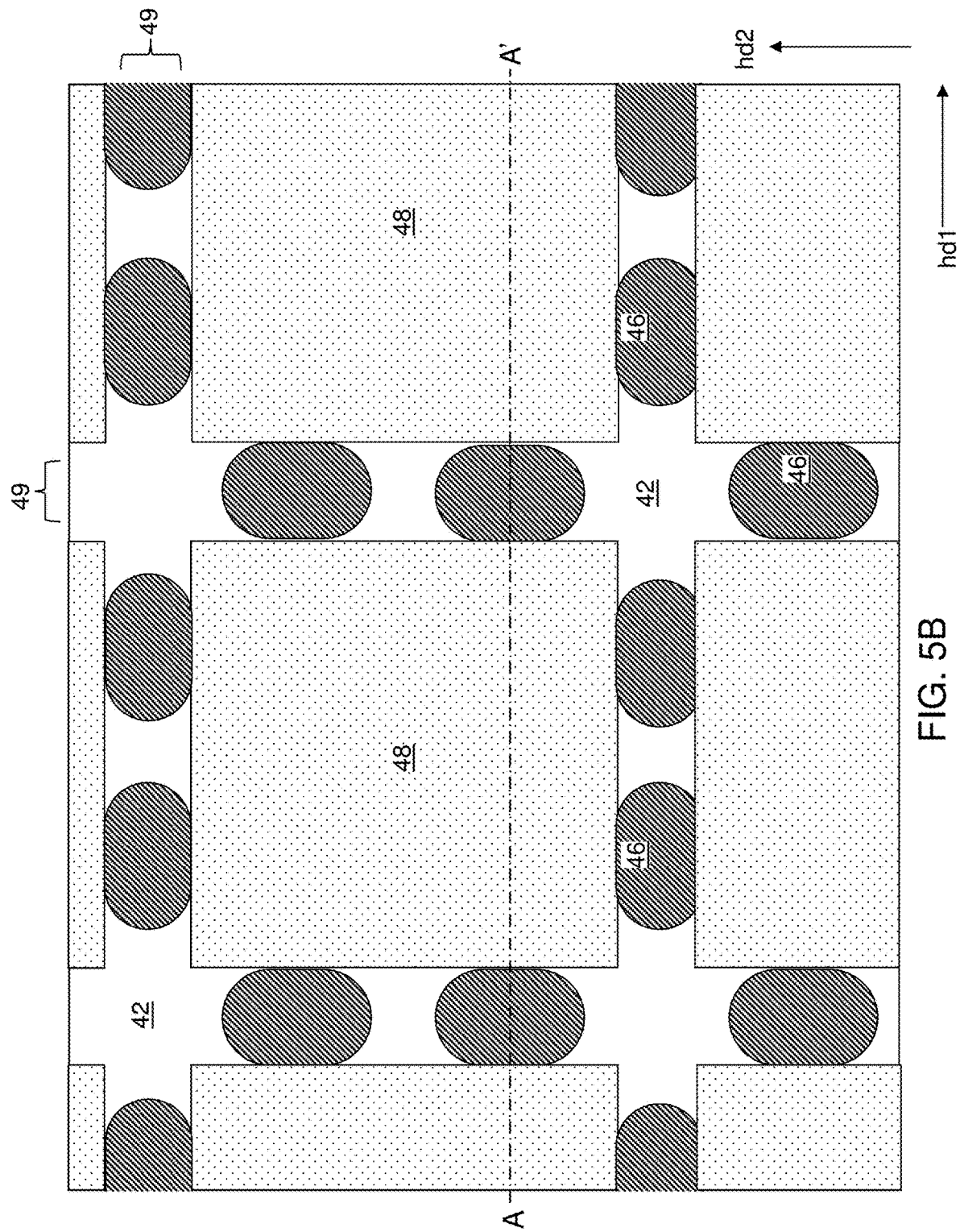
FIG. 5B is a top-down view of the exemplary structure of FIG. 5A according to the first embodiment of the present disclosure.
Figure 5C:
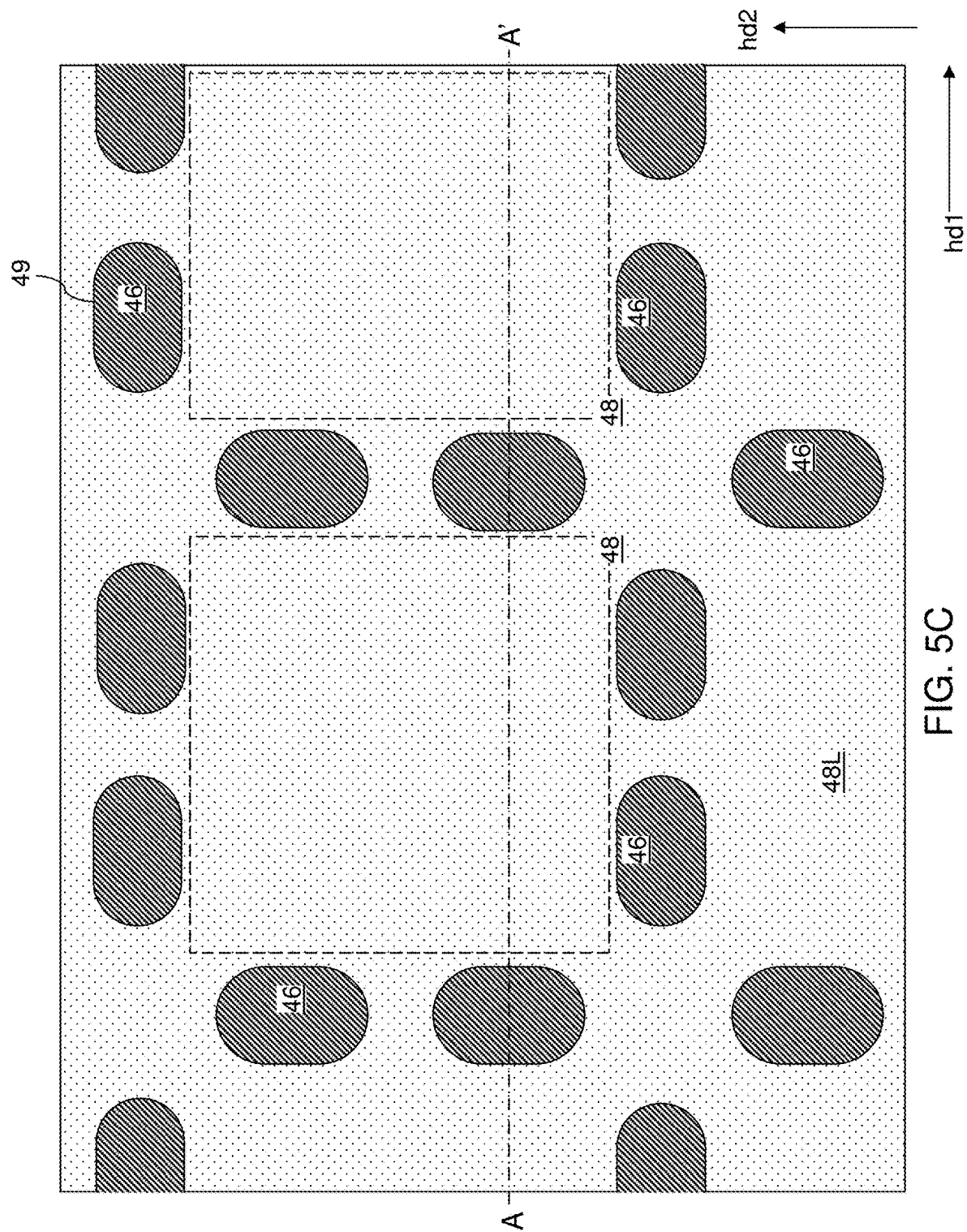
FIG. 5C is a top-down view of the exemplary structure of FIG. 5A according to the second embodiment of the present disclosure.

Referring to FIGS. 5A-5C, the continuous insulating material layer 48L can be patterned to form at least one opening therethrough. FIG. 5A is a vertical cross-sectional view that is the same for a first embodiment and a second embodiment, FIG. 5B is a top-down view for the first embodiment, and FIG. 5C is a top-down view for a second embodiment. For example, a photoresist layer (not shown) can be applied over the continuous insulating material layer 48L, and can be lithographically patterned to form at least one opening therein. The pattern of the openings is selected such that each area of the gap region GR is completely covered by the patterned photoresist layer. An etch process can be performed to remove portions of the continuous insulating material layer 48L that are not covered by the patterned photoresist layer. The etch process can be an isotropic etch process (such as a wet etch process), or can be an anisotropic etch process (such as a reactive ion etch process). The continuous insulating material layer 48L is patterned by the etch process to provide insulating material portions 48. Each insulating material portion 48 overlies a respective gap region GR, and may laterally extend further to cover peripheral areas that laterally surround the respective gap region GR. The photoresist layer can be subsequently removed, for example, by ashing.

In the first embodiment illustrated in FIGS. 5A and 5B, the at least one opening through the photoresist layer, and consequently, the at least one opening 49 that is formed through the continuous insulating material layer 48L may include a first set of line trenches laterally extending along the first horizontal direction hd1 and a second set of line trenches laterally extending along the second horizontal direction hd2. The second horizontal direction hd2 can be perpendicular to the first horizontal direction hd1, and the areas of the first set of line trenches and the second set of line trenches can be selected not to include any of the areas of the gap regions GR. In this case, the insulating material portions 48 may be formed as a two-dimensional array of insulating mesa structures each having a horizontal top surface such that all the horizontal top surfaces of the insulating material portions 48 are within a same horizontal plane. Top surfaces of the underlying metal interconnect structures (46, 44, 425) can be physically exposed between neighboring pairs of the insulating material portions 48. The insulating material portions 48 are arranged as a two-dimensional array of insulating mesa structures not directly contacting one another and having a same two-dimensional periodicity as the two-dimensional array of gap regions GR. The insulating material portions 48 may have tapered sidewalls or vertical sidewalls.

In the second embodiment illustrated in FIGS. 5A and 5C, the at least one opening through the photoresist layer, and consequently, the at least one opening 49 that is formed through the continuous insulating material layer 48L may include discrete openings 49 that overlie a respective one of the conductive via structures 46. A center portion of the top surface of each conductive via structure 46 can be physically exposed underneath each discrete opening through the continuous insulating material layer 48L. In this case, the insulating material portions 48 may be formed portions of the continuous insulating material layer 48L that overlie the gap regions GR. In other words, the areas of the gap regions GR can define the areas of the insulating material portions 48, which can be continuously connected to other insulating material portions 48 within the continuous insulating material layer 48L. The planar horizontal surface regions of the insulating material portions 48 are within the same horizontal plane. Top surfaces of the underlying metal interconnect structures (46, 44, 425) can be physically exposed between neighboring pairs of the insulating material portions 48. Each opening in the continuous insulating metal layer 48L may have tapered sidewalls or vertical sidewalls.

Figure 6A:
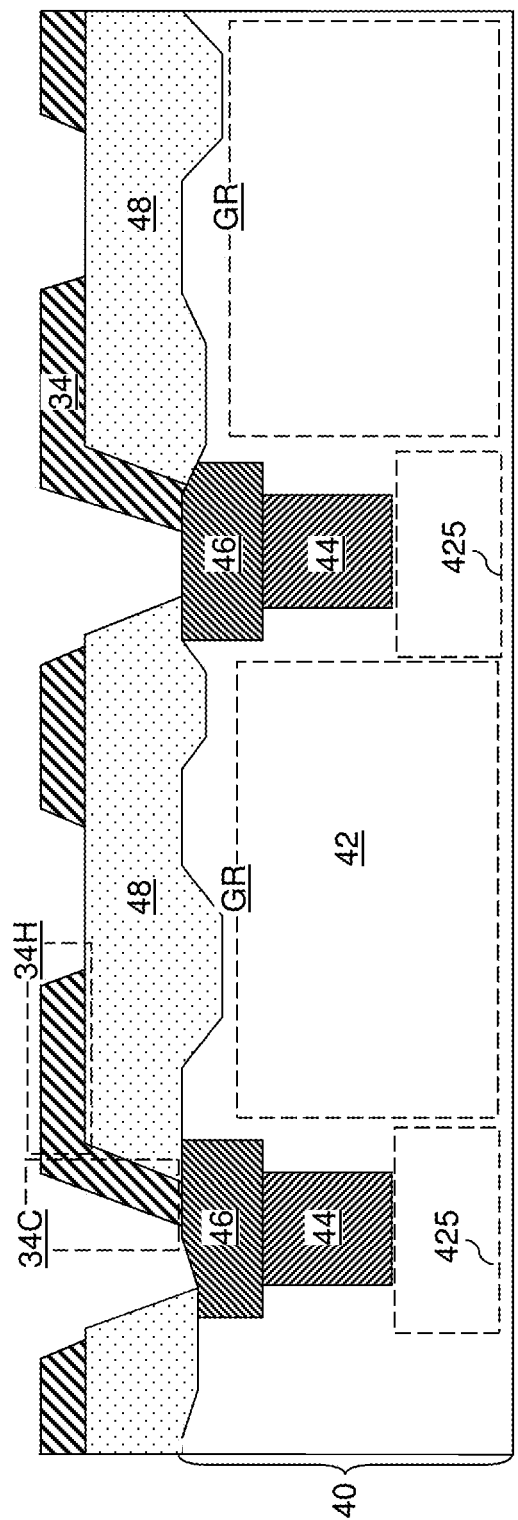
FIG. 6A is a vertical cross-sectional view of the exemplary structure after formation of a two-dimensional array of metal plate clusters according to the first and second embodiments of the present disclosure.
Figure 6B:
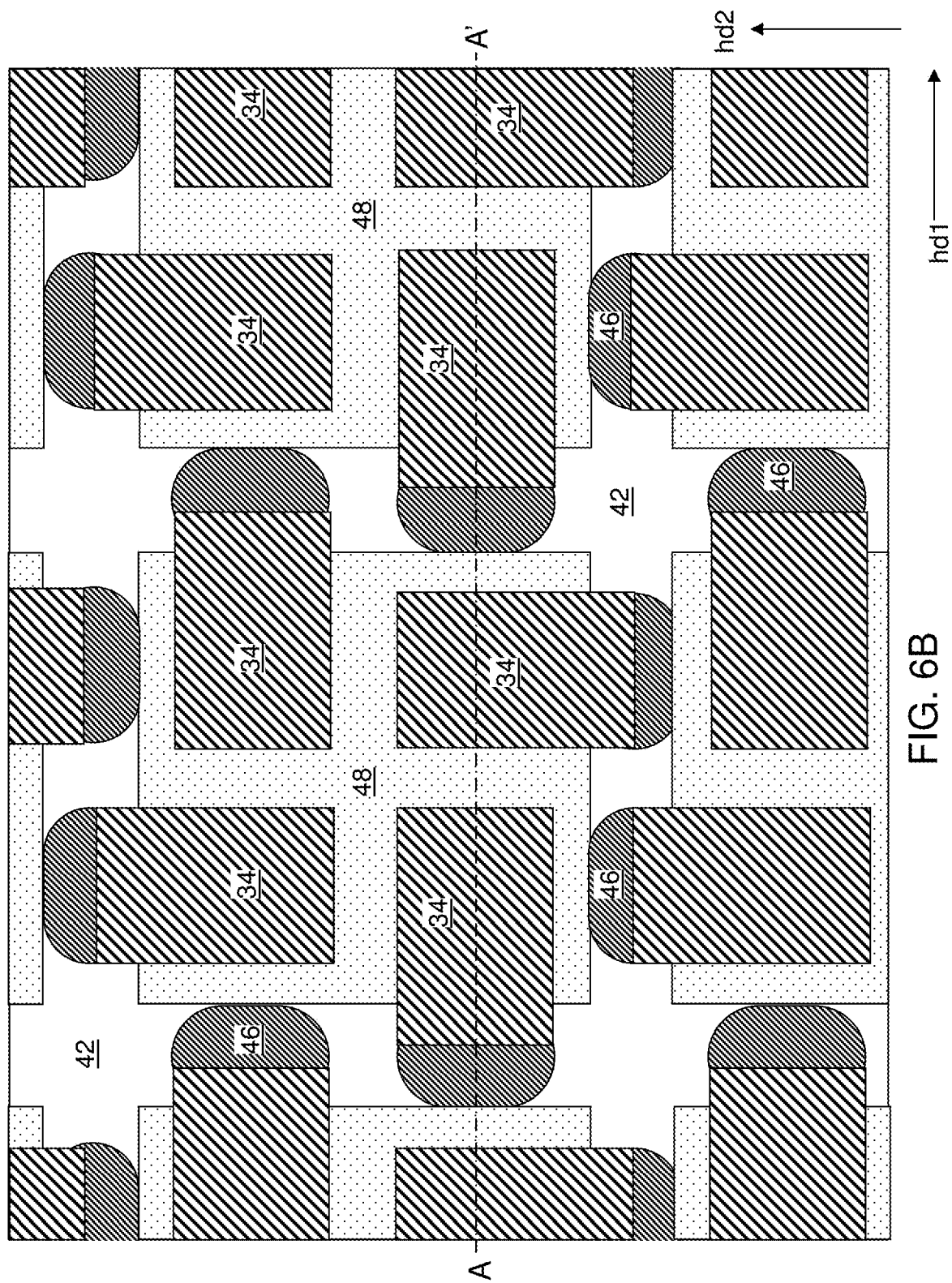
FIG. 6B is a top-down view of the exemplary structure of FIG. 6A according to the first embodiment of the present disclosure.
Figure 6C:
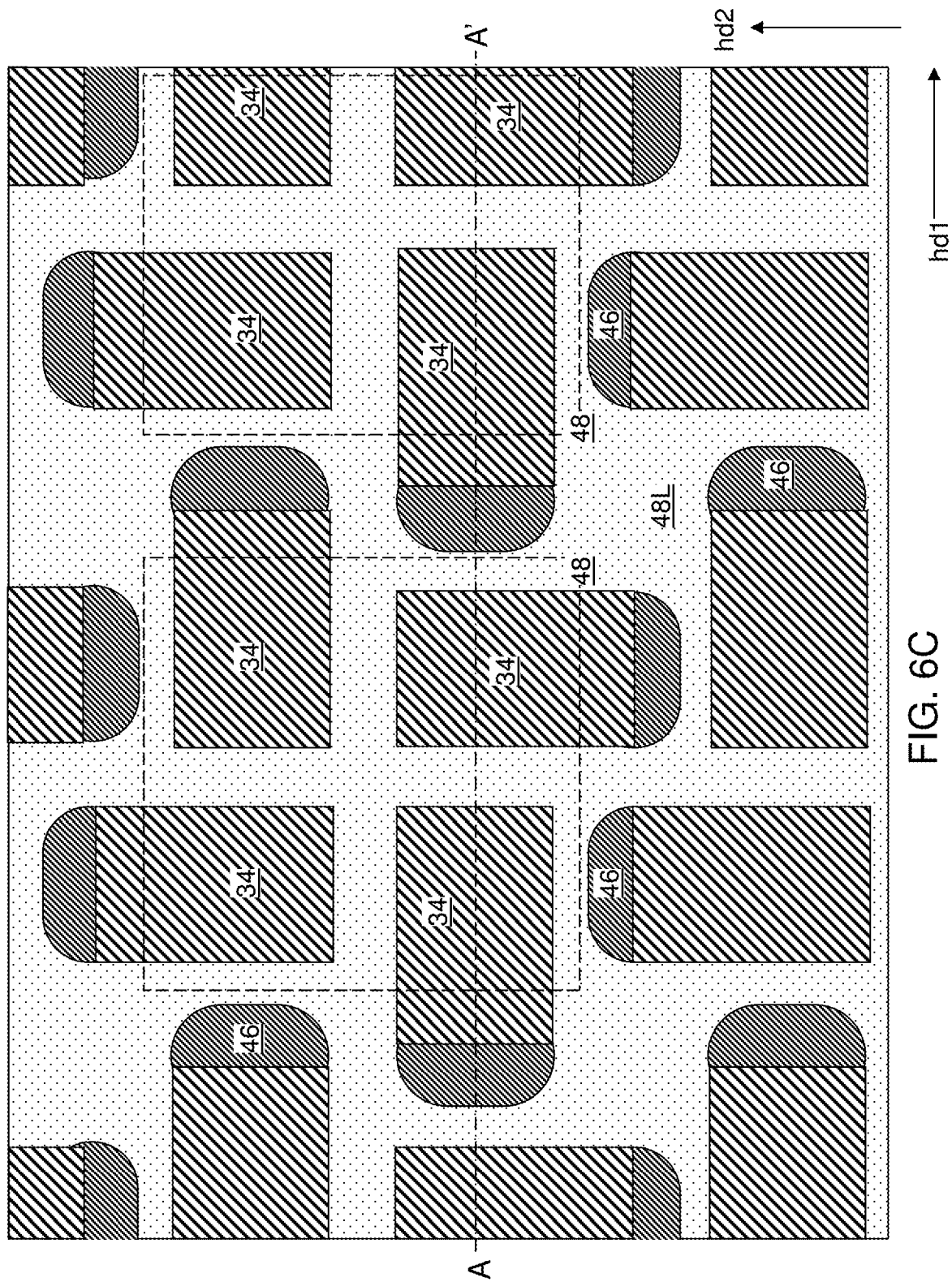
FIG. 6C is a top-down view of the exemplary structure of FIG. 6A according to the second embodiment of the present disclosure.

Referring to FIGS. 6A-6C, a two-dimensional array of metal plate clusters can be formed over the two-dimensional array of insulating material portions 48. In one embodiment, a continuous metal layer can be deposited over the insulating material portions 48 and on top surfaces of the metal interconnect structures (46, 44, 425) that are physically exposed in the openings 49, such as the physically exposed top surfaces of the conductive via structures 46. The continuous metal layer can be subsequently patterned to form a two-dimensional array of metal plate clusters. Alternatively, the two-dimensional array of metal plate clusters can be formed by forming a patterned photoresist layer, depositing a metal layer employing a non-conformal deposition process (such as physical vapor deposition or vacuum evaporation), and by lifting off the patterned photoresist layer.

Each patterned portion of the continuous metal layer constitutes a metal plate 34. A cluster of metal plates 34 overlies each insulating material portion 48, which overlies a respective gap region GR. Each set of patterned portions of the continuous metal layer overlying a same insulating material portion 48 constitutes a metal plate cluster. The two-dimensional array of metal plate clusters includes a first metallic material, which may be a barrier metallic material having a relatively high melting point to prevent damage during a subsequent bonding process that reflows a solder material. For example, the first metallic material can include, or consist essentially of, tungsten, titanium, tungsten nitride, tantalum nitride, titanium nitride, aluminum, platinum, tin, copper, an alloy thereof, or a combination (such as a stack) thereof. In one example, the first metallic material can include, or consist essentially of, a stack of a titanium layer and an aluminum layer. In another example, the first metallic material can include, or consist essentially of, a stack of a titanium layer, a platinum layer, and a tin layer. The thickness of each metal plate 34 can be selected to provide sufficiently low electrical resistance without excessively increasing thermal mass (which can reduce effectiveness during a subsequent bonding process). For example, the thickness of each metal plate 34 can be in a range from 300 nm to 12 microns, although lesser and greater thicknesses can also be employed.

Generally, a two-dimensional array of metal plate clusters is formed over the two-dimensional array of insulating material portions 48 with the same two-dimensional periodicity. Each of the metal plate clusters comprises a plurality of metal plates 34. Each metal plate 34 includes a horizontal metal plate portion 34H overlying a planar top surface region of a respective insulating material portion 48 and a connection metal portion 34C extending between the horizontal metal plate portion 34H and a respective one of the metal interconnect structures (46, 44, 425). Each of the connection metal portions 34C can be formed directly on a tapered sidewall or a vertical sidewall of a respective one of the insulating material portions 48 and a top surface of a respective metal interconnect structure (46, 44, 425), such as a top surface of a conductive via structure 46.

In the first configuration illustrated in FIGS. 6A and 6B, the insulating material portions 48 are arranged as a two-dimensional array of insulating mesa structures not directly contacting one another and having the same two-dimensional periodicity as the two-dimensional array of metal plate clusters. In the second configuration illustrated in FIGS. 6A and 6C, each connection metal portion 34C extends through a respective opening 49 through the continuous insulating material layer that includes the two-dimensional array of insulating material portions 48, which overlies, and has the same two-dimensional periodicity as, the two-dimensional array of gap regions GR.

Figure 7A:
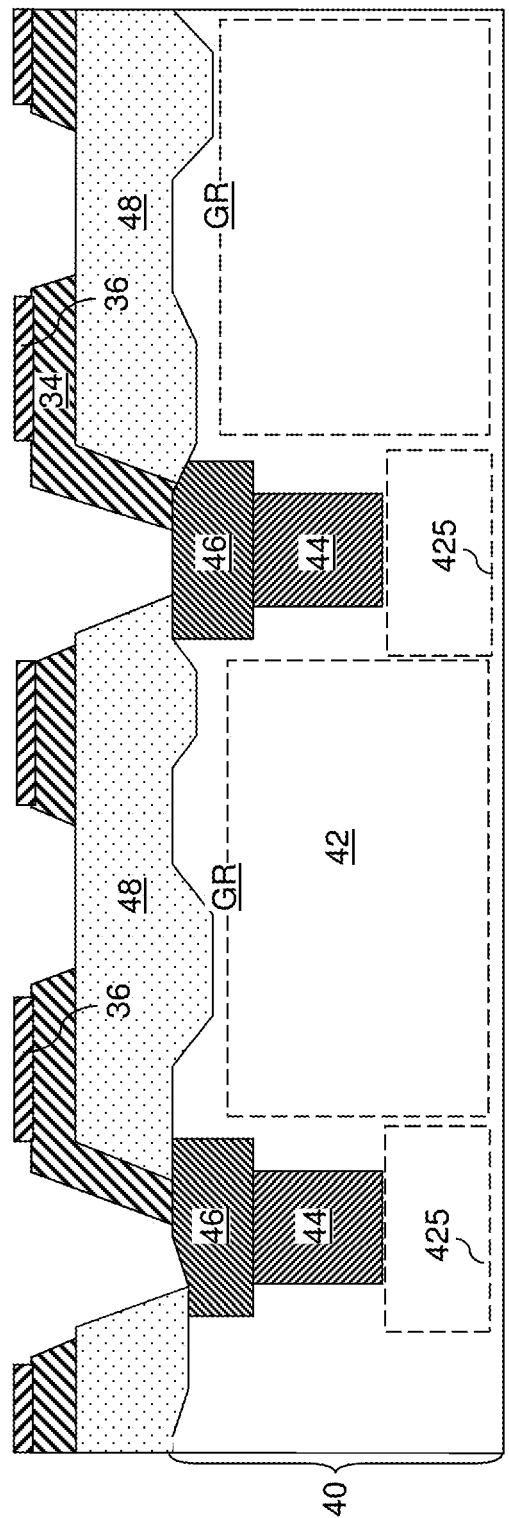
FIG. 7A is a vertical cross-sectional view of the exemplary structure after formation of a two-dimensional array of backplane-side bonding pads according to the first and second embodiments of the present disclosure.
Figure 7B:
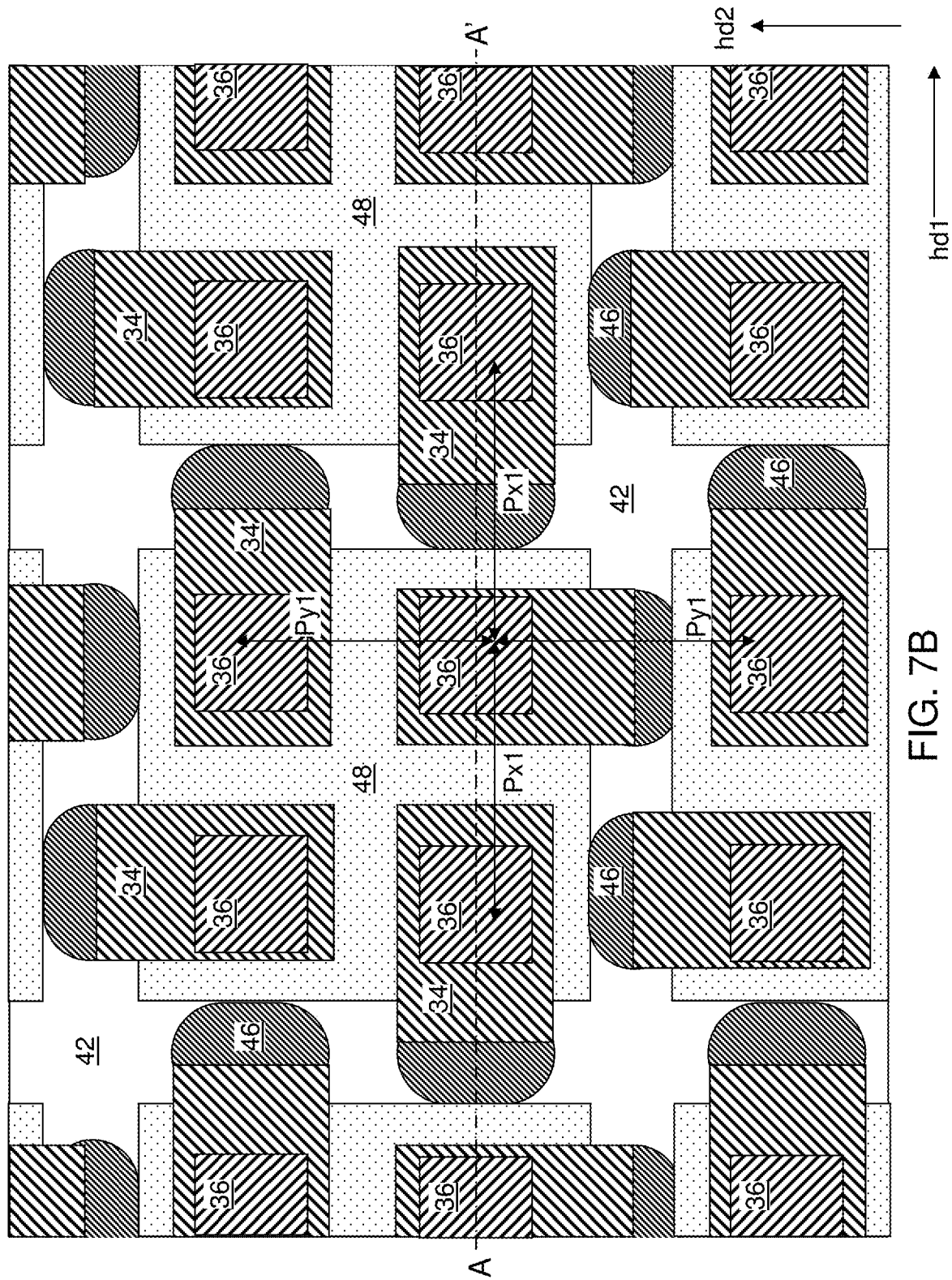
FIG. 7B is a top-down view of the exemplary structure of FIG. 7A according to the first embodiment of the present disclosure.
Figure 7C:
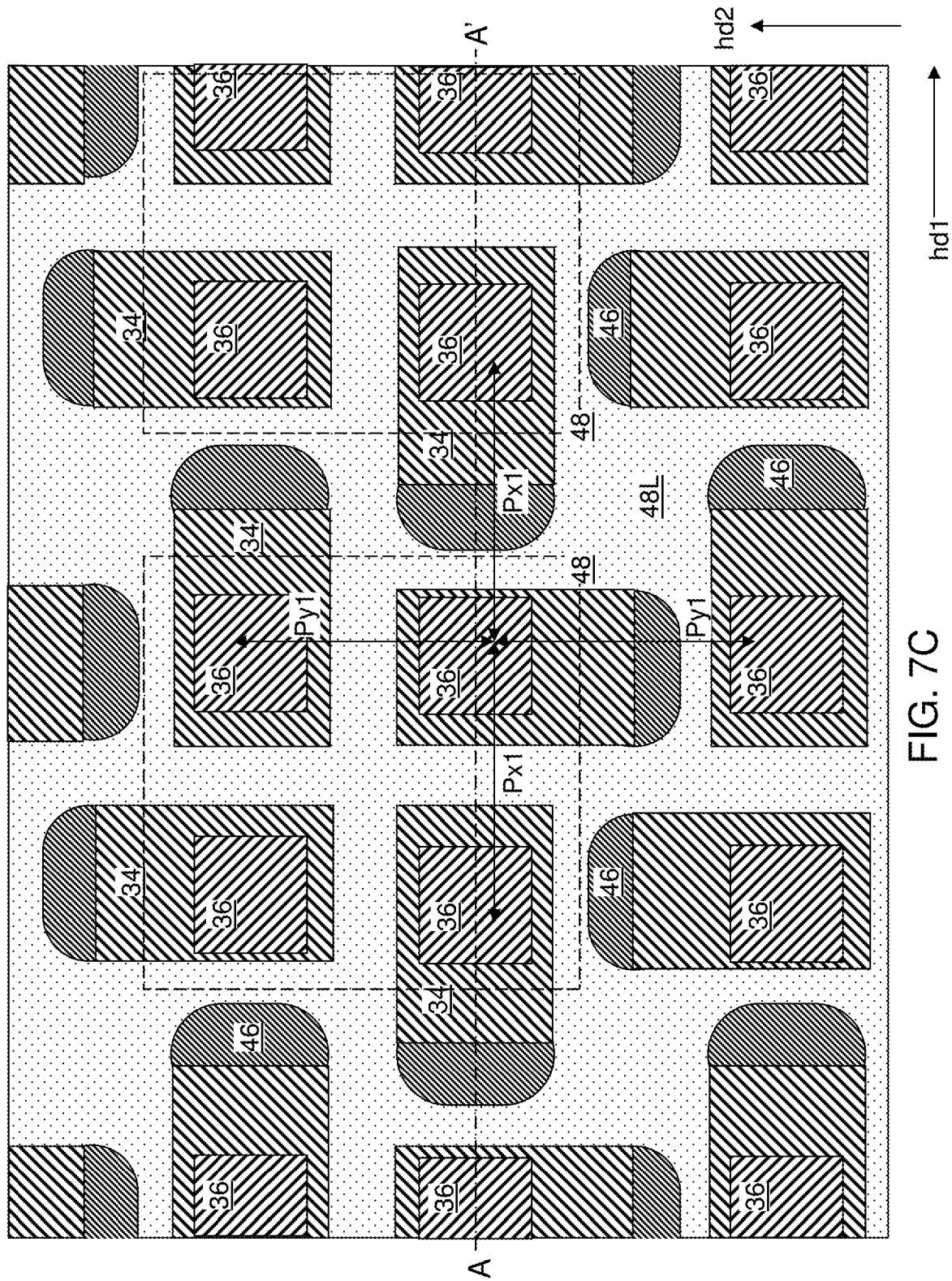
FIG. 7C is a top-down view of the exemplary structure of FIG. 7A according to the second embodiment of the present disclosure.

Referring to FIGS. 7A-7C, a two-dimensional array of backplane-side bonding pads 36 can be formed by deposition and patterning of at least one second metallic material. In one embodiment, the second material layer can be deposited as a continuous metallic material layer, and a photoresist layer can be applied and patterned over the continuous metallic material layer. An etch process can be performed to remove the second metallic material selective to the first metallic material, thereby patterning the continuous metallic material layer into the two-dimensional array of backplane-side bonding pads 36. Alternatively, a patterned photoresist layer can be employed as a mask layer, and the second metallic material can be anisotropically deposited on physically exposed surfaces of the metal plates 34 and over the patterned photoresist layer. A lift-off process can be employed to remove the patterned photoresist layer and portions of the second metallic material layer thereupon. Remaining portions of the second metallic material constitute the two-dimensional array of backplane-side bonding pads 36. The two-dimensional array of backplane-side bonding pads 36 is formed on top of the two-dimensional array of metal plate clusters. The second metallic material may be the same as, or may be different from, the first metallic material. The second metallic material can include, or consist essentially of, tungsten, titanium, tantalum, tungsten nitride, tantalum nitride, titanium nitride, aluminum, platinum, tin, copper, an alloy thereof, or a combination (such as a stack) thereof. In one example, the second metallic material can include, or consist essentially of, a stack of a titanium layer and an aluminum layer. In another example, the second metallic material can include, or consist essentially of, a stack of a titanium layer, a platinum layer, and a tin layer. The thickness of each backplane-side bonding pad 36 can be selected to provide sufficiently low electrical resistance without excessively increasing thermal mass (which can reduce effectiveness during a subsequent bonding process). For example, the thickness of each backplane-side bonding pad 36 can be in a range from 300 nm to 12 microns, although lesser and greater thicknesses can also be employed. In case the second metallic material is different from the first metallic material, the second metallic material of the backplane-side bonding pads 36 can have a higher thermal conductivity than the first metallic material, and can have a lower melting point than the first metallic material.

In one embodiment, each of the backplane-side bonding pads 36 can be formed on a respective one of the horizontal metal plate portions 34H. A set of M×N backplane-side bonding pads 36 can be formed as an M×N rectangular periodic array over a respective insulating material portion 48. In one embodiment, the pitch of the two-dimensional array of metal plate clusters along the first horizontal direction hd1 can be M times the primary-direction pitch Px1, and the pitch of the two-dimensional array of metal plate clusters along the second horizontal direction hd2 can be N times the secondary-direction pitch Py1. In this case, the entire set of backplane-side bonding pads 36 can be formed as a two-dimensional periodic array having the periodicity of the primary-direction pitch Px1 along the first horizontal direction hd1 and having the periodicity of the secondary-direction pitch Py1 along the second horizontal direction hd2.

Figure 8:
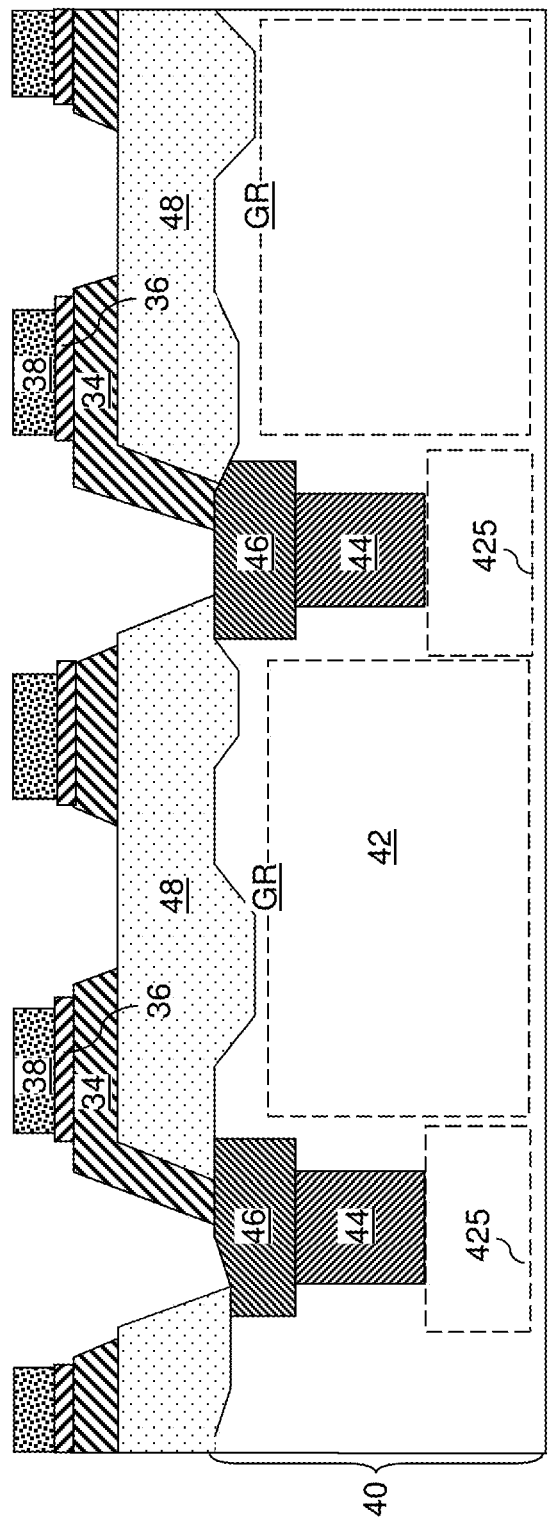
FIG. 8 is a vertical cross-sectional view of the exemplary structure after formation of backplane-side solder material portions on the two-dimensional array of backplane-side bonding pads according to the first and second embodiments of the present disclosure.

Referring to FIG. 8, optional backplane-side solder material portions 38 can be formed on the two-dimensional array of backplane-side bonding pads 36. The optional backplane-side solder material portions 38 can include tin, and optionally copper, silver, and/or other additive metals that lowers the eutectic point of the solder material. Alternatively, the backplane-side bonding pads 36 can be formed of a solder material and the backplane-side solder material portions 38 can be omitted.

Figure 9:
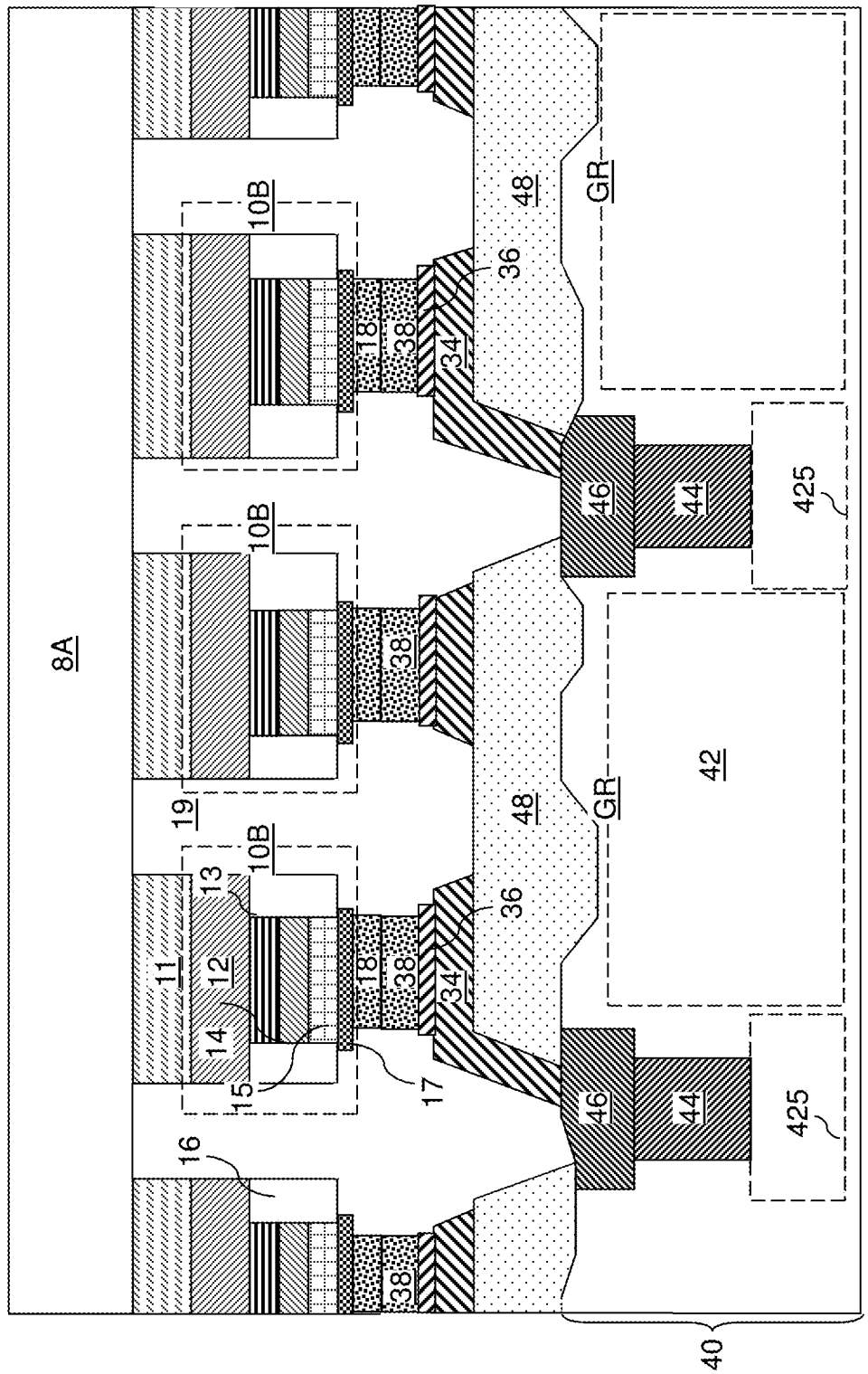
FIG. 9 is a vertical cross-sectional view of the exemplary structure after disposing a first source substrate over the backplane such that the first light emitting devices face the backplane according to the first and second embodiments of the present disclosure.

Referring to FIG. 9, a first source substrate 8A with first light emitting devices 10B is provided. The first source substrate 8A includes an optically transparent material such as sapphire. A layer stack including an undoped III-V compound material layer, an n-doped III-V compound material layer, a multi-quantum-well layer, a p-doped compound semiconductor layer, and a transparent conductive layer can be sequentially formed on the first source substrate 8A during manufacture of first light emitting devices 10B.

Insulating material portions 16 including a dielectric material (such as silicon oxide, silicon nitride, aluminum oxide, etc.) can be formed to delineate the lateral extent of each first light emitting device 10B. Dicing channels 19 can be formed through the layer stack to divide the layer stack into stacks of an undoped III-V compound material layer 11 and a first light emitting device 10B. Each first light emitting device 10B can include a vertical stack of an n-doped III-V compound material layer 12, an active region, such as a multi-quantum-well 13, a p-doped III-V compound semiconductor layer 14, and a transparent conductive layer. 15. In a non-limiting illustrative example, each undoped III-V compound material layer 11 can include undoped gallium nitride, each n-doped III-V compound material layer 12 can include n-doped gallium nitride or indium gallium nitride, each multi-quantum-well 13 can include a periodic repetition of gallium nitride layers and indium gallium nitride layers, each p-doped III-V compound semiconductor layer 14 can include p-doped gallium nitride or aluminum gallium nitride, and/or each transparent conductive layer 15 can include a transparent conductive oxide, such as indium tin oxide. Layer 12 can be a bulk layer or a plurality of nanowires. The active region 13 and the layer 14 can be planar layers or nanowire shells. The first light emitting devices 10B emit light at a first peak wavelength (e.g., in the blue wavelength range).

A device-side bonding pad 17 can be formed on each first light emitting device 10B. Each device-side bonding pad 17 can include bonding pad material such as Ni, Au, and/or Cu. Optionally, a device-side solder material portion 18 can be formed on each device-side bonding pad 17. The device-side solder material portions 18 can include tin, and optionally copper, silver, and/or other additive metals that lowers the eutectic point of the solder material. The device-side solder material portions 18 can include, for example, a lead-free solder material.

The first source substrate 8A can be disposed over the backplane 40 with first solder material portions (18, 38) therebetween such that the device-side bonding pads 17 of the first light emitting devices 10B face the backplane-side bonding pads 36 through the first solder material portions (18, 38). The first source substrate 8A and the first light emitting devices 10B can be aligned such that pairs of a source-side solder material portion 18 and a device-side solder material portion 38 make direct contact, or are placed in sufficient proximity to induce merging therebetween upon reflow.

Figure 10:
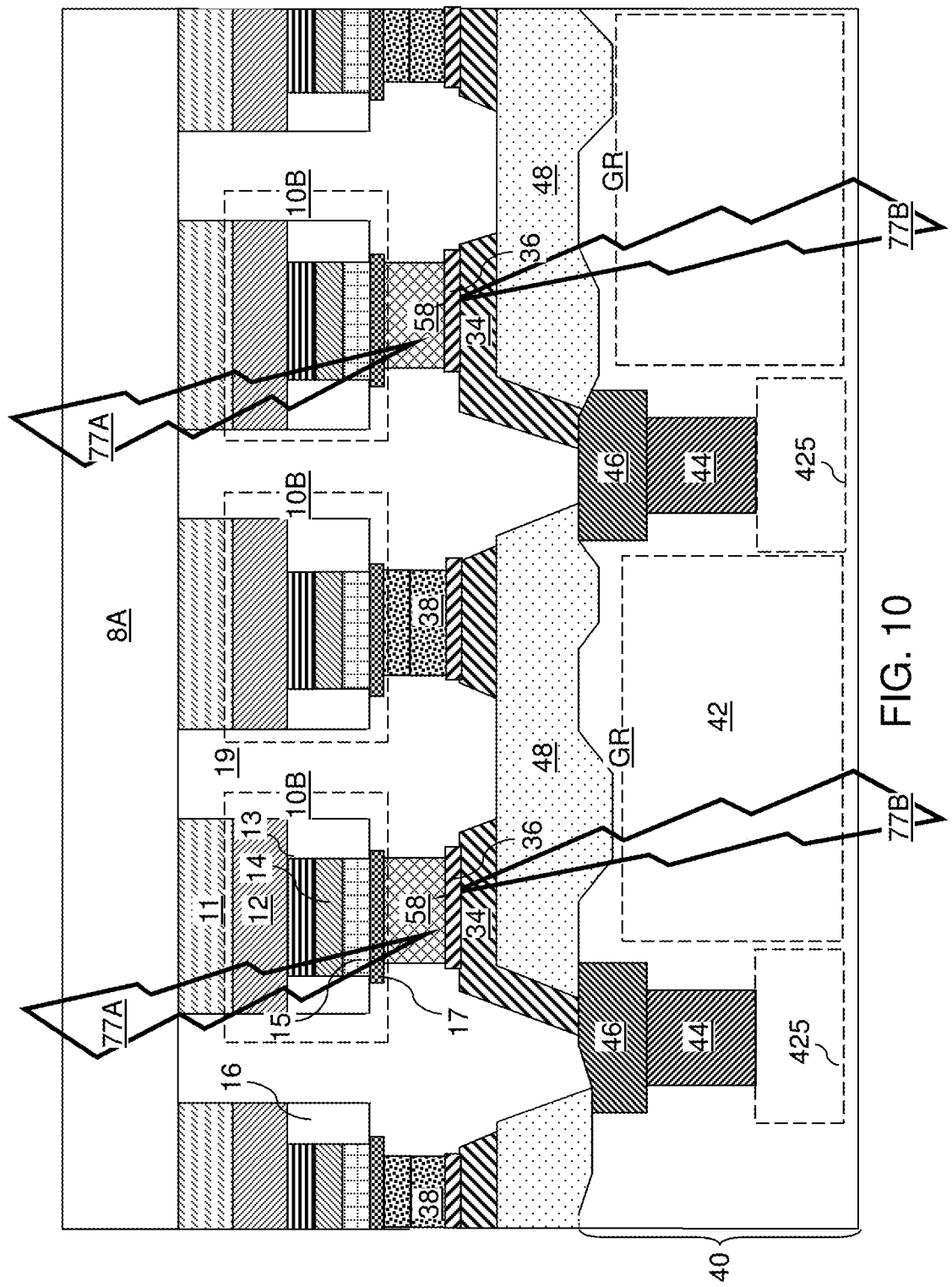
FIG. 10 is a vertical cross-sectional view of the exemplary structure after selective bonding a subset of the first light emitting devices to the backplane employing a laser irradiation reflow process according to the first and second embodiments of the present disclosure.

Referring to FIG. 10, a subset of the first light emitting devices 10B is selectively bonded to the backplane 40. Any suitable selective bonding process may be used. For example, selective laser bonding or thermal (e.g., furnace) bonding process may be used to reflow the solder material portions (18, 38).

For example, as shown in FIG. 10, in one embodiment, the bonding process comprises laser bonding employing a laser irradiation reflow process. A heating laser can be employed to bond a selected subset of the first light emitting devices 10B to the backplane 40. The pattern of selection for the selected subset of the first light emitting devices 10B can be, for example, the pattern illustrated in FIG. 2B. Specifically, bonding of the selected subset of the first light emitting devices 10B to the backplane 40 can be performed by irradiating a first laser beam (77A or 77B) to at least one solder material portion (18, 38) to reflow the at least one solder material portion (18, 38).

In one embodiment, the first laser beam 77A can pass through the first substrate 8A and through the selected subset of first light emitting devices 10B to the at least one solder material portion (18, 38) to reflow the at least one solder material portion (18, 38).

In another embodiment, if the backplane substrate 42 is optically transparent, then the first laser beam 77B can pass through the backplane to heat the at least one solder material portion (18, 38). if the backplane substrate. The first laser beam 77B of the heating laser can pass through the gap region GR of the substrate 42 to avoid collateral heating of metal interconnect structures (46, 44, 425) other than the irradiated metal plate 34, the irradiated backplane-side bonding pad 36, and the irradiated solder material portions (18, 38). In one embodiment, the heating laser may employ infrared wavelength. For example, the heating laser can be a visible or infra-red laser having a wavelength in a range from 0.4 micron to 20 microns, such as 1 to 2 microns, to avoid heating of the backplane 40, while heating the at least one solder material portion (18, 38). In another embodiment, both laser beams (77A, 77B) can be used to irradiate the at least one solder material portion (18, 38) either simultaneously or sequentially.

In another alternative embodiment, a thermal (e.g., furnace) bonding process rather than a laser process may be used to reflow the solder material portions (18, 38). In this embodiment, the solder material portions 18 have a different composition and a different melting point, as described in U.S. Pat. No. 9,893,041 B2, incorporated herein by reference in its entirety. In the thermal bonding process, the lowest melting point solder material portions (18, 38) are reflowed and bonded first at a temperature above their respective melting point but below the respective melting point of the other solder material portions which are not bonded. Subsequently, the next lowest melting point solder material portions (18, 38) are reflowed and bonded second at a temperature above their respective melting point but below the respective melting point of the remaining higher melting point solder material portions which are not bonded. This process is repeated as many times as needed to sequentially bond all the pairs of solder material portions.

The heated and reflowed at least one solder material portion (18, 38) solidifies into a bonded solder material portion 58, which provides bonding between the backplane 40 and a respective first light emitting devices 10B through a backplane-side bonding pad 36, a metal plate 34, and a device-side bonding pad 17. A subset, but not all, of the first light emitting devices 10B can be bonded to the backplane 40 by selectively reflowing a subset of the first solder material portions (18, 38).

Figure 11:
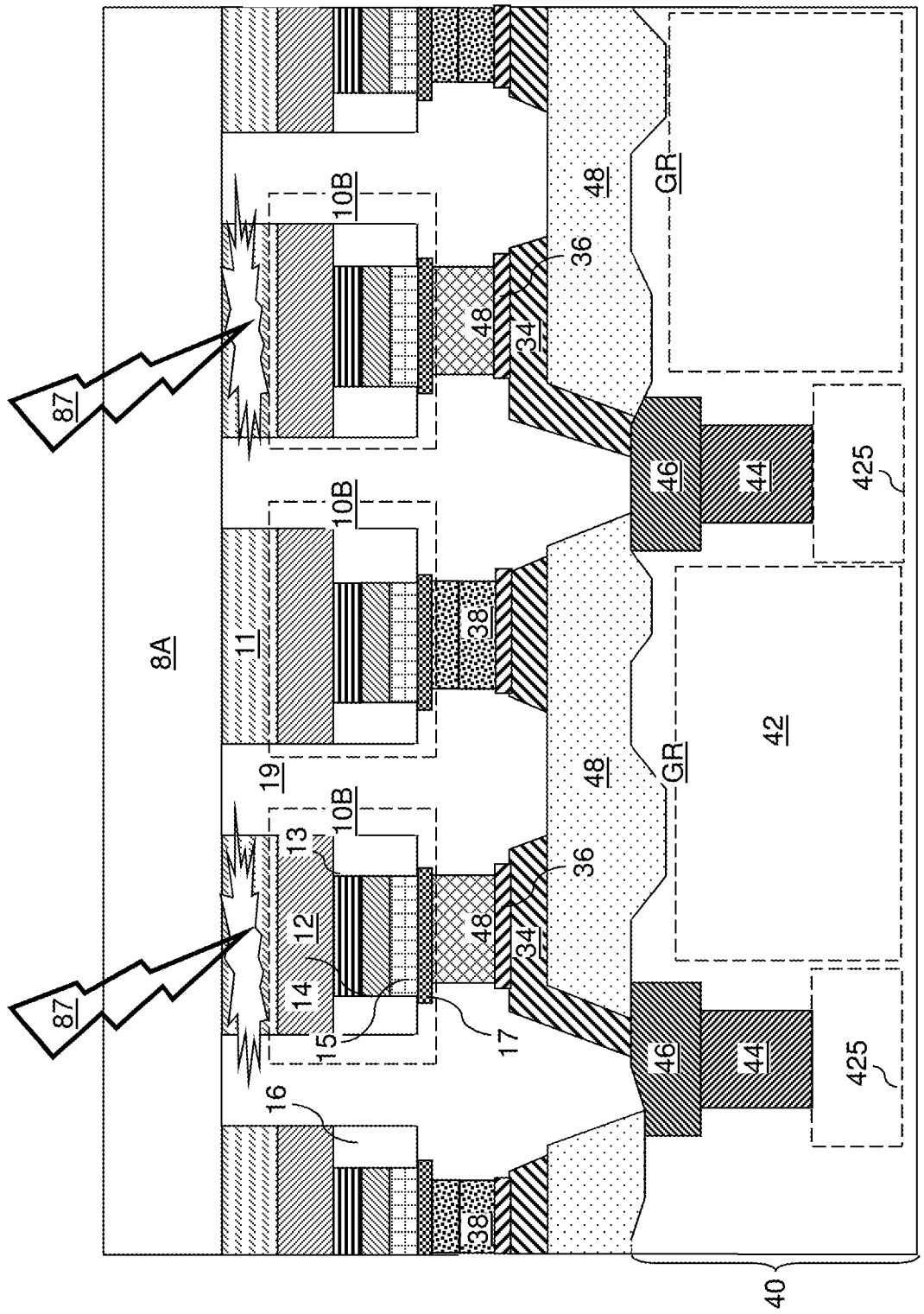
FIG. 11 is a vertical cross-sectional view of the exemplary structure after selective dissociation of the subset of the first light emitting devices from the first source substrate employing a selective laser ablation process according to the first and second embodiments of the present disclosure.

Referring to FIG. 11, the subset of the first light emitting devices 10B that are bonded to the backplane 40 can be selectively dissociated from the first source substrate 8A employing a selective laser ablation process. Each bonded light emitting device 10 can be dissociated from the first source substrate 8A by irradiating a second laser beam 87 through the first source substrate 8A and onto each III-V compound material layer 11 in contact with the bonded first light emitting devices 10B. In one embodiment, the first source substrate 8A comprises sapphire, and each III-V compound material layer 11 comprises a compound semiconductor material (such as an undoped III-V compound semiconductor material). In this case, the second laser beam 87 ablates each III-V compound material layer 11 in contact with the bonded first light emitting devices 10B. The wavelength of the laser (which is herein referred to an "ablation laser") employed to provide the second laser beam 87 can be different (e.g., shorter) from the wavelength of the heating laser. The wavelength of the ablation laser can be, for example between 0.1 and 0.75 micron, such as 0.25 to 0.5 micron. In one embodiment, the wavelength of the ablation laser can be within an ultraviolet range, i.e., within a range from 10 nm to 400 nm. Each first light emitting device 10B that is bonded to the backplane 40 through a respective reflowed and re-solidified solder material portion 48 can be dissociated employing laser ablation of the compound semiconductor material (i.e., the material of the III-V compound material layer 11) located between the first source substrate 8A and each first light emitting device 10B that is bonded to the backplane 40.

Figure 12:
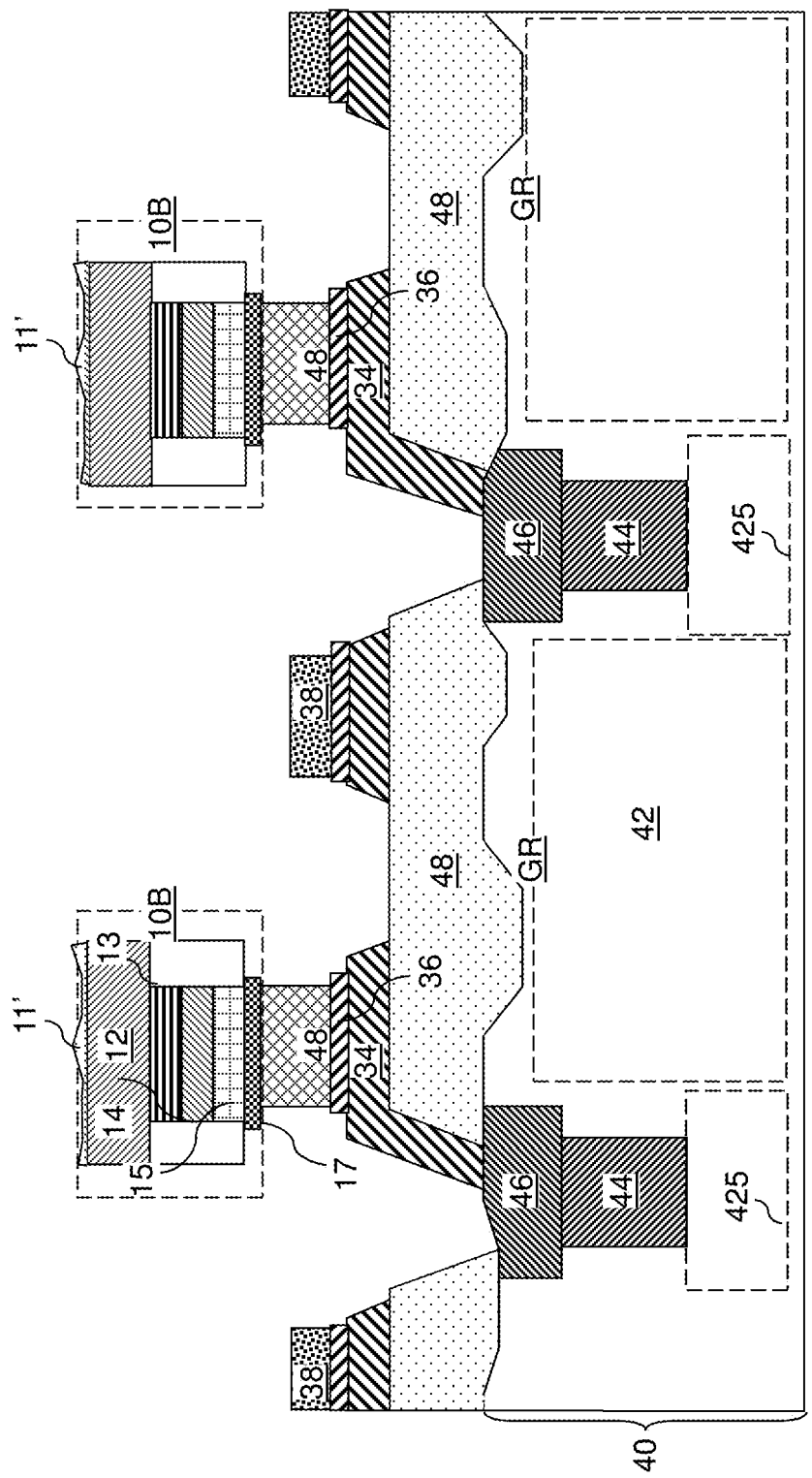
FIG. 12 is a vertical cross-sectional view of the exemplary structure after separating the assembly of the backplane and the subset of the first light emitting devices an assembly of the first source substrate and remaining first light emitting devices according to the first and second embodiments of the present disclosure.

Referring to FIG. 12, an assembly of the backplane 40 and the set of all first light emitting devices 10B bonded thereto can be separated from an assembly of the first source substrate 8A and the set of all first light emitting devices 10B that are not bonded to the backplane 40. Residual portions of the III-V compound material layer 11 can be present on the distal surfaces of the first light emitting devices 10B that are attached to the backplane 40. Specifically, compound semiconductor material portions 11' having irregular surface height variations can be located on the distal surfaces of the first light emitting diodes 10B. The distal surfaces are surfaces of the first light emitting diodes 10B facing away from the backplane 40.

Figure 13:
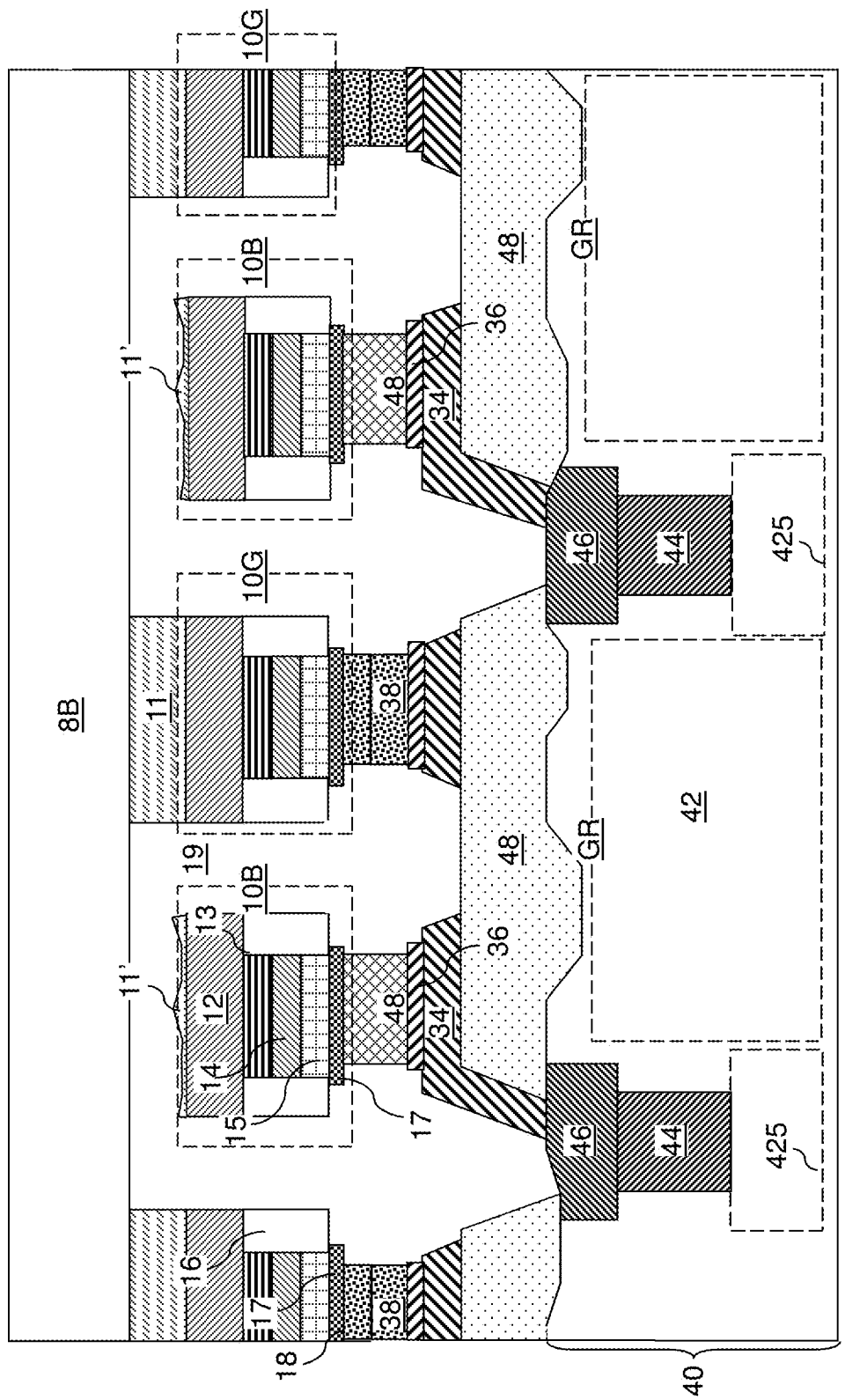
FIG. 13 is a vertical cross-sectional view of the exemplary structure after disposing a second source substrate over the backplane such that the second light emitting devices face the backplane according to the first and second embodiments of the present disclosure.

Referring to FIG. 13, second light emitting diodes 10G can be transferred as illustrated in FIG. 2C. A second source substrate 8B with second light emitting diodes 10G thereupon can be provided. The second light emitting devices 10G emit light at a second peak wavelength (e.g., in the green visible range) that is different from the first wavelength (e.g., in the blue visible range). The second source substrate 8B can have the same structural and compositional characteristics as the first source substrate 8A. The second light emitting devices 10G can be formed in the same manner as the first light emitting devices 10B with modifications in material compositions to shift the second wavelength from the first wavelength. The second source substrate 8B can be disposed over the backplane 40 with second solder material portions (38, 18) therebetween such that the device-side bonding pads 17 of the second light emitting devices 10G face a subset of the backplane-side bonding pads 36 through the second solder material portions (18, 38). A subset, but not all, of the second light emitting devices 10G can be bonded to the backplane 40 by selectively reflowing a subset of the second solder material portions (18, 38). The pattern of selection for the bonded set of second light emitting devices 10G can be the pattern illustrated in FIG. 2C. The processing steps of FIG. 10 can be employed mutandis mutatis for the bonding process that selectively bonds a subset of the second light emitting diodes 10G to the backplane 40.

Subsequently, the processing steps of FIG. 11 can be performed mutandis mutatis to dissociate all second light emitting devices 10G that are bonded to the backplane 40 from the second transparent substrate 8B.

Figure 14A:
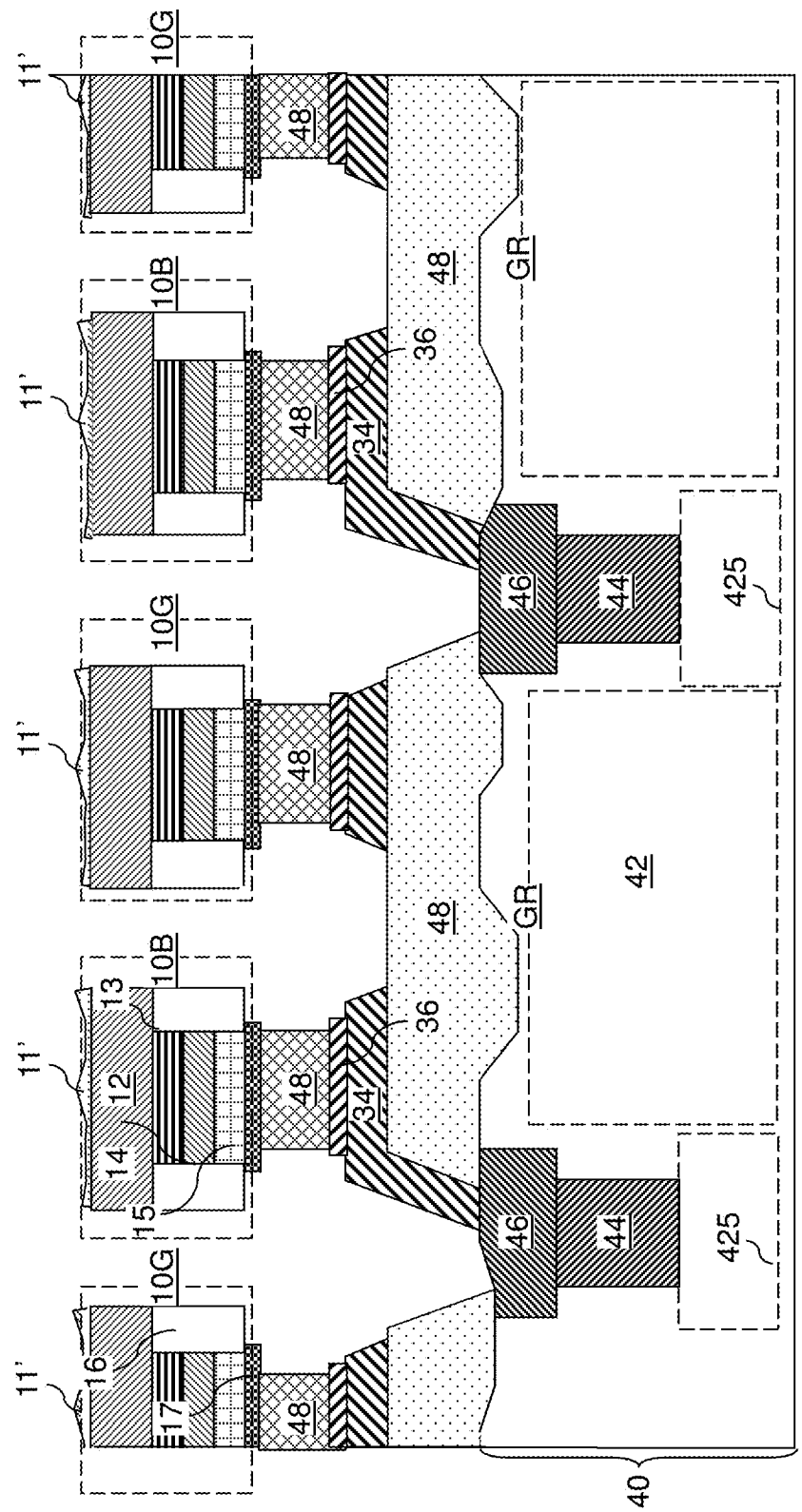
FIG. 14A is a vertical cross-sectional view of the exemplary structure transfer of a set of a first light emitting device, a second light emitting device, and a third light emitting device to each metal plate cluster according to the first and second embodiments of the present disclosure.
Figure 14B:
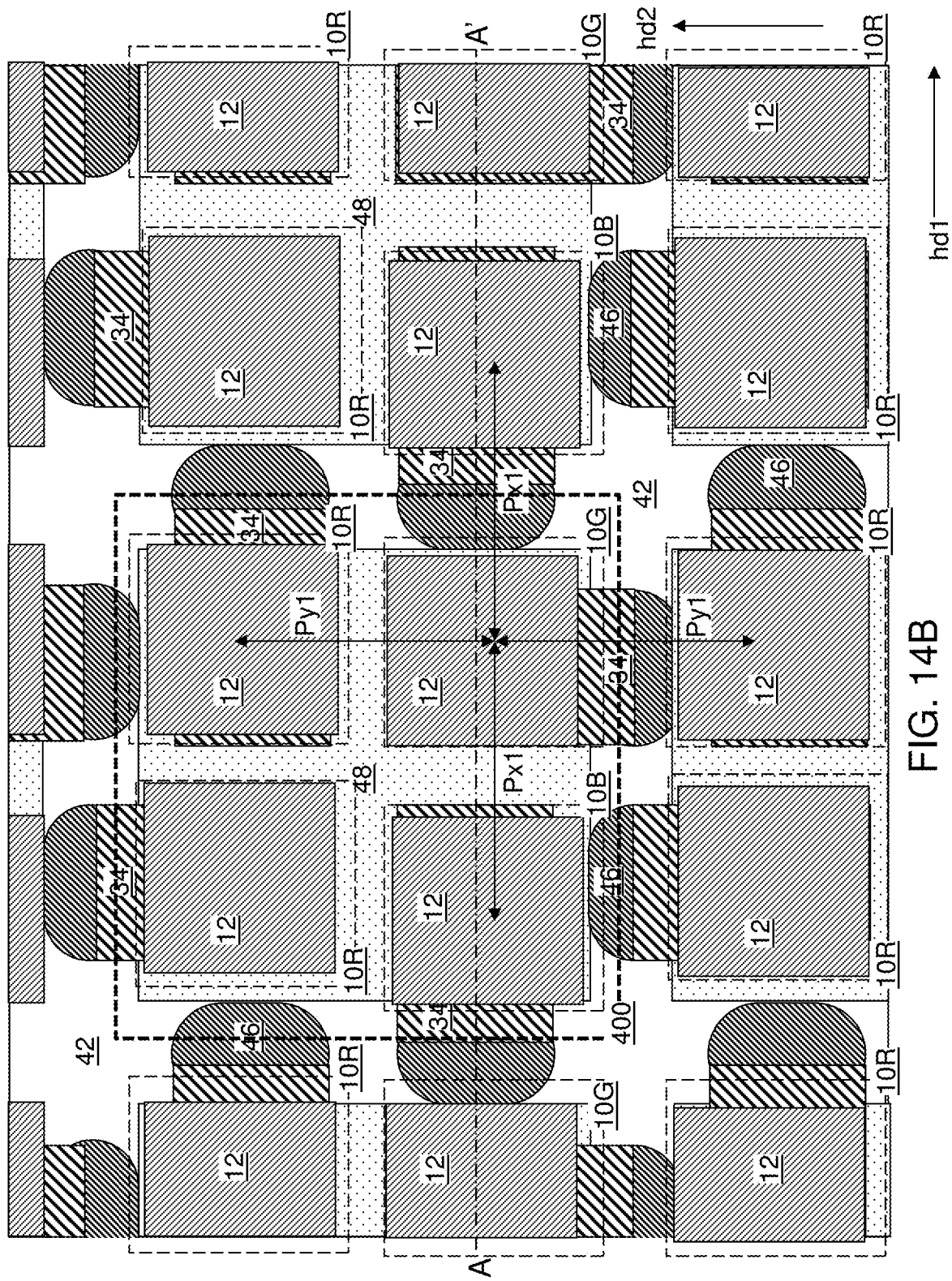
FIG. 14B is a top-down view of the exemplary structure of FIG. 14A according to the first embodiment of the present disclosure.
Figure 14C:
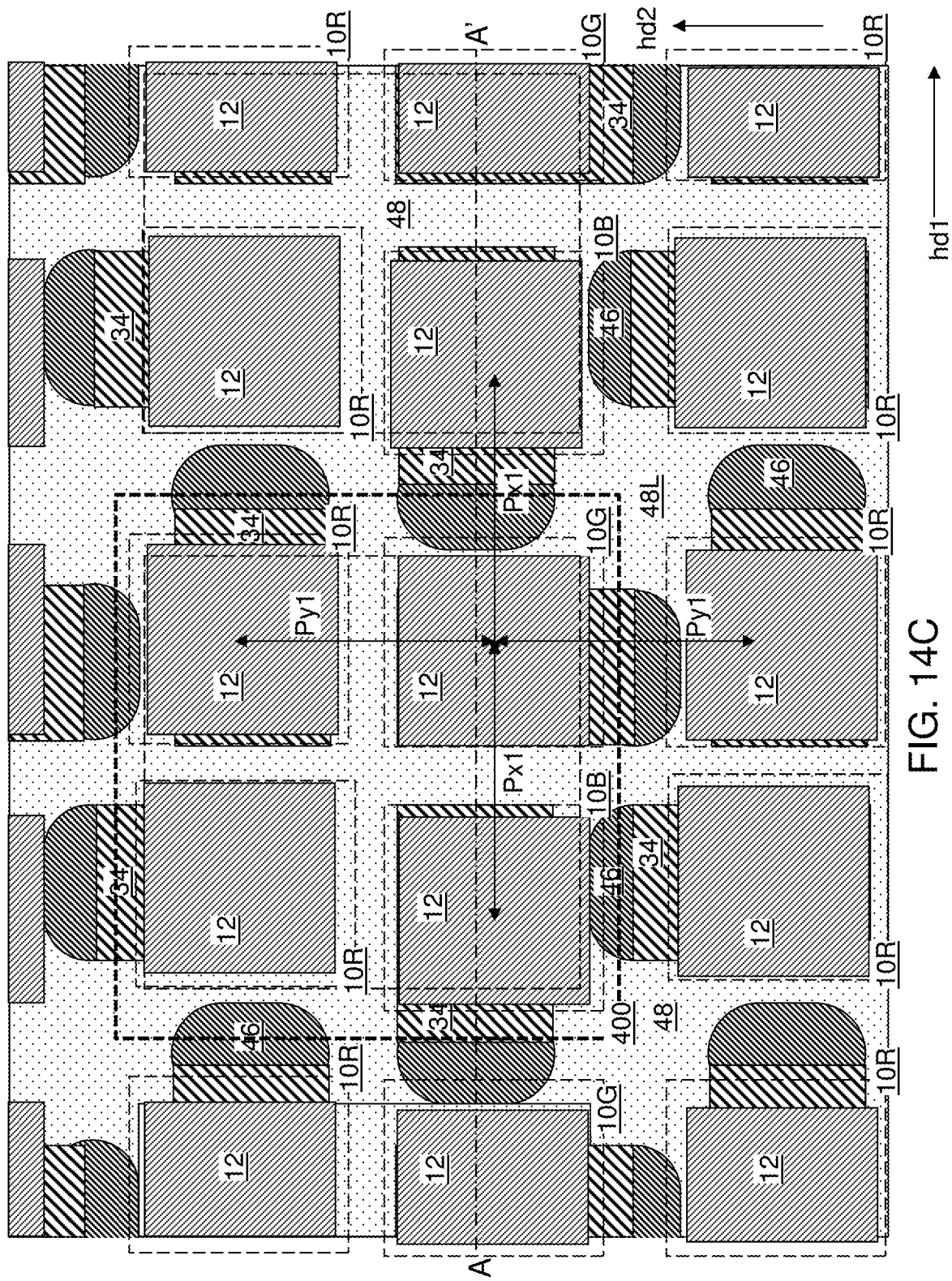
FIG. 14C is a top-down view of the exemplary structure of FIG. 14A according to the second embodiment of the present disclosure.

Referring to FIGS. 14A-14C, the processing steps of FIGS. 9-11 can be repeatedly performed with necessary changes to bond multiple types of light emitting diodes (10B, 10G, 10R) to the two-dimensional array of metal plate clusters. For example, red light emitting diodes 10R can be bonded to the backplane 40. Each set of light emitting diodes (10B, 10G, 10R) attached to a metal plate cluster constitutes a light emitting device cluster 400 which can constitute a pixel of a direct view display device, and each of the light emitting diodes can be a subpixel of the direct view display device. The pixel 400 is configured to provide an arbitrary color that can be generated by combination of light of multiple peak wavelengths with different intensities. The pixel 400 can have any suitable shape and configuration and can have any suitable number of light emitting devices (i.e., any suitable number of LEDs) (10B, 10G, 10R). For example, each pixel 400 can include two red light emitting LEDs 10R, one blue light emitting LED 10B and one greed light emitting LED 10G. The red light emitting LEDs 10R can be located next to each other or diagonally from each other in each pixel 400. Thus, a two-dimensional array of light emitting device clusters 400 can be bonded to the backplane 40 through respective bonding structures (36, 48, 17). Each light emitting device cluster 400 comprises a plurality of light emitting devices (10B, 10G, 10R) overlying a respective metal plate cluster.

Referring to all drawings and according to various embodiments of the present disclosure, a light emitting device assembly is provided, which comprises: a backplane 40 comprising the substrate 42 and embedding metal interconnect structures (46, 44, 425) therein; insulating material portions 48 including a respective planar top surface region and located over the backplane 40, wherein all planar top surface regions of the insulating material portions are within a same horizontal plane; a two-dimensional array of metal plate clusters, wherein each of the metal plate clusters comprises a plurality of metal plates 34, each metal plate 34 including a horizontal metal plate portion 34H overlying a planar top surface region of a respective insulating material portion 48 and a connection metal portion 34C extending between the horizontal metal plate portion 34H and a respective one of the metal interconnect structures (46, 44, 425); and a two-dimensional array of light emitting device clusters bonded to the backplane 40 through respective bonding structures (36, 48, 18), wherein each light emitting device cluster comprises a plurality of light emitting devices (10B, 10G, 10R) overlying a respective metal plate cluster.

In one embodiment, the light emitting device comprises compound semiconductor material portions 11 having irregular surface height variations and located on distal surfaces of the light emitting devices (10B, 10G, 10R), the distal surfaces being surfaces of the light emitting devices facing away from the backplane 40. In one embodiment, the bonding structures (36, 48, 18) comprise a two-dimensional array of backplane-side bonding pads 36 located on top of the two-dimensional array of metal plate clusters, wherein each of the backplane-side bonding pads 36 is located on a respective one of the horizontal metal plate portions 34H. In one embodiment, each of the light emitting devices (10B, 10G, 10R) within the two-dimensional array of light emitting device clusters includes a device-side bonding pad 17 that is bonded to a respective one of the backplane-side bonding pads 36 through a solder material portion 48.

In one embodiment, the metal interconnect structures (46, 44, 425) are arranged to provide a rectangular two-dimensional array of gap regions GR in which the metal interconnect structures (46, 44, 425) are not present; the insulating material portions 48 are located over each of the gap regions GR; and the plurality of metal plates 34 overlies a respective one of the gap regions GR. In one embodiment, the two-dimensional array of light emitting device clusters has a same two-dimensional periodicity as the two-dimensional array of metal plate clusters, i.e., a first periodicity of M times Px1 along the first horizontal direction hd1 and a second periodicity of N times Py1 along the second horizontal direction hd2 in which M is an integer greater than 1 and N is an integer greater than 1.

In one embodiment, each of the connection metal portions 34C contacts a tapered sidewall or a vertical sidewall of a respective one of the insulating material portions 48 and a top surface of a respective metal interconnect structure (46, 44, 425). In a first embodiment, the insulating material portions 48 are arranged as a two-dimensional array of insulating mesa structures not directly contacting one another and having a same two-dimensional periodicity as the two-dimensional array of metal plate clusters. In a second embodiment, the insulating material portions 48 are portions of a continuous insulating material layer 48L that covers a top surface of the backplane 40; and each connection metal portion 34C extends through a respective opening through the continuous insulating material layer 48L.

The embodiments of the present disclosure provide the following non-limiting advantages. The planar top surface regions facilitate uniform bonding of LEDs by providing coplanar surfaces for LED bonding to the backplane. The insulating material portions may be pliable (i.e., have a lower elastic module than the backplane substrate) to improve alignment of multiple light emitting devices during bonding.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. Where an embodiment employing a particular structure and/or configuration is illustrated in the present disclosure, it is understood that the present invention may be practiced with any other compatible structures and/or configurations that are functionally equivalent provided that such substitutions are not explicitly forbidden or otherwise known to be impossible to one of ordinary skill in the art.

What is claimed is:

1. A light emitting device assembly comprising:
a backplane comprising a substrate containing metal interconnect structures;
insulating material portions having a lower elastic modulus than the substrate, wherein the insulating material portions are located over the backplane and contain a respective planar top surface region such that the planar top surface regions of the insulating material portions are located within a same horizontal plane;
a two-dimensional array of metal plate clusters, wherein each of the metal plate clusters comprises a plurality of metal plates, each metal plate including a horizontal metal plate portion overlying a planar top surface region of a respective insulating material portion and a connection metal portion extending between the horizontal metal plate portion and a respective one of the metal interconnect structures; and
a two-dimensional array of light emitting device clusters bonded to the backplane through respective bonding structures, wherein each light emitting device cluster comprises a plurality of light emitting devices overlying a respective metal plate cluster.

2. The light emitting device assembly of claim 1, further comprising compound semiconductor material portions having irregular surface height variations located on distal surfaces of the light emitting devices, the distal surfaces being surfaces of the light emitting devices facing away from the backplane.

3. The light emitting device assembly of claim 1, wherein the bonding structures comprise a two-dimensional array of backplane-side bonding pads located on top of the two-dimensional array of metal plate clusters, wherein each of the backplane-side bonding pads is located on a respective one of the horizontal metal plate portions.

4. The light emitting device assembly of claim 3, wherein each of the light emitting devices within the two-dimensional array of light emitting device clusters includes a device-side bonding pad that is bonded to a respective one of the backplane-side bonding pads through a solder material portion.

5. The light emitting device assembly of claim 1, wherein:
the metal interconnect structures are arranged to provide a rectangular two-dimensional array of gap regions in which the metal interconnect structures are not present;
the insulating material portions are located over each of the gap regions; and the plurality of metal plates overlies a respective one of the gap regions.

6. The light emitting device assembly of claim 1, wherein each light emitting device cluster comprises a pixel of a direct view display device.

7. The light emitting device assembly of claim 1, wherein:
the two-dimensional array of light emitting device clusters has a same two-dimensional periodicity as the two-dimensional array of metal plate clusters; and
each of the connection metal portions contacts a tapered sidewall or a vertical sidewall of a respective one of the insulating material portions and a top surface of a respective metal interconnect structure.

8. The light emitting device assembly of claim 7, wherein the insulating material portions are arranged as a two-dimensional array of insulating mesa structures not directly contacting one another and having a same two-dimensional periodicity as the two-dimensional array of metal plate clusters.

9. The light emitting device assembly of claim 7, wherein:
the insulating material portions are portions of a continuous insulating material layer that covers a top surface of the backplane; and
each connection metal portion extends through a respective opening through the continuous insulating material layer.

10. The light emitting device assembly of claim 1, wherein:
the substrate of the backplane comprises a first dielectric material having a first elastic modulus; and
the insulating material portions are located on the substrate of the backplane and comprise a second dielectric material having a second elastic modulus that is less than 80% of the first elastic modulus.

* * * * *